US011532667B2

(12) United States Patent
Saito et al.

(10) Patent No.: US 11,532,667 B2
(45) Date of Patent: Dec. 20, 2022

(54) MAGNETIC LAMINATED FILM, MAGNETIC MEMORY ELEMENT, AND MAGNETIC MEMORY

(71) Applicant: TOHOKU UNIVERSITY, Miyagi (JP)

(72) Inventors: Yoshiaki Saito, Miyagi (JP); Shoji Ikeda, Miyagi (JP); Hideo Sato, Miyagi (JP); Tetsuo Endoh, Miyagi (JP)

(73) Assignee: TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 17/430,040

(22) PCT Filed: Oct. 30, 2019

(86) PCT No.: PCT/JP2019/042667
§ 371 (c)(1),
(2) Date: Aug. 11, 2021

(87) PCT Pub. No.: WO2020/166141
PCT Pub. Date: Aug. 20, 2020

(65) Prior Publication Data
US 2022/0115440 A1  Apr. 14, 2022

(30) Foreign Application Priority Data
Feb. 13, 2019  (JP) .............................. JP2019-024012

(51) Int. Cl.
*G11C 11/18* (2006.01)
*H01L 27/22* (2006.01)
(Continued)

(52) U.S. Cl.
CPC .......... *H01L 27/228* (2013.01); *G11C 11/161* (2013.01); *G11C 11/1673* (2013.01);
(Continued)

(58) Field of Classification Search
CPC ....... H01L 27/228; H01L 43/02; H01L 43/10; H01L 21/8239; H01L 27/105;
(Continued)

(56) References Cited

U.S. PATENT DOCUMENTS 7,218,484 B2 * 5/2007 Hashimoto ............. H01L 43/08
360/324.1
9,218,864 B1   12/2015 Yi et al.
(Continued)

FOREIGN PATENT DOCUMENTS

JP       2014179447 A    9/2014
JP       2015179773 A   10/2015
(Continued)

OTHER PUBLICATIONS

International Search Report issued in PCT/JP2019/042667 dated Dec. 24, 2019.

*Primary Examiner* — Hien N Nguyen
(74) *Attorney, Agent, or Firm* — Fox Rothschild LLP; Robert J. Sacco; Carol E. Thorstad-Forsyth

(57) ABSTRACT

Provided are a magnetic stacked film that is capable of improving a write efficiency, and a magnetic memory element and a magnetic memory using the magnetic stacked film. A magnetic stacked film 1 is a stacked film for a magnetic memory element 100, and includes: a heavy metal layer 2 that contains β phase $W_{1-x}Ta_x$ (0.00<x≤0.30); and a recording layer 10 that includes a ferromagnetic layer 18 having a reversible magnetization direction and is adjacent to the heavy metal layer 2, in which a thickness of the heavy metal layer 2 is 2 nm or more and 8 nm or less.

15 Claims, 19 Drawing Sheets

(51) Int. Cl.
*G11C 11/16* (2006.01)
*H01F 10/32* (2006.01)
*H01L 43/02* (2006.01)
*H01L 43/10* (2006.01)

(52) U.S. Cl.
CPC ........ G11C 11/1675 (2013.01); H01F 10/329 (2013.01); H01F 10/3254 (2013.01); H01F 10/3286 (2013.01); H01L 43/02 (2013.01); H01L 43/10 (2013.01)

(58) Field of Classification Search
CPC ....... H01L 29/82; H01L 43/08; G11C 11/161; G11C 11/1673; G11C 11/1675; G11C 11/1659; G11C 11/18; H01F 10/3254; H01F 10/3286; H01F 10/329; H01F 10/30
See application file for complete search history.

(56) References Cited

U.S. PATENT DOCUMENTS

| | | | |
|---|---|---|---|
| 2014/0056060 A1* | 2/2014 | Khvalkovskiy | H01L 43/08 365/158 |
| 2017/0222135 A1* | 8/2017 | Fukami | G11C 11/1675 |
| 2020/0058338 A1* | 2/2020 | Ishikawa | G11C 11/1673 |

FOREIGN PATENT DOCUMENTS

| | | |
|---|---|---|
| JP | 2017059594 A | 3/2017 |
| JP | 2017112351 A | 6/2017 |
| JP | 2018022796 A | 2/2018 |
| WO | 2016021468 A1 | 2/2016 |
| WO | 2017208576 A1 | 12/2017 |

* cited by examiner

MAGNETIC LAMINATED FILM, MAGNETIC MEMORY ELEMENT, AND MAGNETIC MEMORY

CROSS REFERENCE TO RELATED APPLICATIONS

The present application is a U.S. National Phase of International Patent Application No. PCT/JP2019/042667, filed Oct. 30, 2019, which claims the benefit and priority of Japanese Patent Application No. 2019-024012 which was filed on Feb. 13, 2019. The entirety of these applications are incorporated herein by reference.

TECHNICAL FIELD

The present invention relates to a magnetic stacked film, a magnetic memory element, and a magnetic memory.

BACKGROUND ART

A magnetic random access memory (MRAM) using a magnetoresistance effect element (a magnetic tunnel junction: MTJ) as a memory element has been known as a next-generation nonvolatile magnetic memory in which high-speed properties and high rewrite tolerance can be obtained. A spin transfer torque random access memory (STT-MRAM) element performing magnetization reversal with respect to the magnetic tunnel junction by using spin transfer torque (refer to PTL 1) and a spin-orbit torque magnetic random access memory (SOT-MRAM) element performing magnetization reversal with respect to the MTJ by using spin orbit torque (refer to PTL 2) have been gathering attention as a next-generation magnetic memory element used in the MRAM.

The STT-MRAM element includes a MTJ having a three-layer structure of a ferromagnetic layer (also referred to as a recording layer)/an insulating layer (also referred to as a barrier layer)/a ferromagnetic layer (also referred to as a reference layer). The STT-MRAM element has properties in which the resistance of the element is high in an anti-parallel state in which a magnetization direction of the recording layer and a magnetization direction of the reference layer are antiparallel to each other, and records data by allowing a parallel state and an anti-parallel state to correspond to 0 and 1. In the STT-MRAM element, a current penetrating through the MTJ is applied, and thus, electron spins of which the directions are aligned in a constant direction flow into the recording layer, and the magnetization direction of the recording layer is reversed by the torque of the electron spins that flow into the recording layer. Accordingly, the STT-MRAM element is capable of recording data by switching the parallel state and the anti-parallel state.

The SOT-MRAM element has a configuration in which a MTJ having a three-layer structure of a ferromagnetic layer/an insulating layer/a ferromagnetic layer is provided on a heavy metal layer. In the case of a Co—Fe type magnetic body that is currently used, as with the STT-MRAM element, the SOT-MRAM element has properties in which the resistance of the element is higher in an anti-parallel state in which a magnetization direction of the recording layer and a magnetization direction of the reference layer are antiparallel to each other than in a parallel state in which the magnetization direction of the recording layer and the magnetization direction of the reference layer are parallel to each other, and records data by allowing the parallel state and the anti-parallel state to correspond to 0 and 1. In the SOT-MRAM element, a current is applied to the heavy metal layer, and thus, a spin current is induced by a spin orbit interaction, and a spin polarized by the spin current flows into the recording layer, and therefore, the recording layer is subjected to magnetization reversal. Accordingly, the SOT-MRAM element is capable of recording data by switching the parallel state and the anti-parallel state.

In the SOT-MRAM element, in order for high integration, an architecture has been proposed in which a plurality of MTJs are arranged on the heavy metal layer (refer to PTL 2). In the architecture of PTL 2, data is written in the MTJ by using a mechanism in which magnetic anisotropy of the MTJ can be controlled by applying a voltage to the MTJ. First, the voltage is applied to the MTJ in which data is to be written, the magnetic anisotropy of the recording layer is decreased, and a state in which the recording layer is easily subjected to magnetization reversal (also referred to as a half-selected state) is set. After that, the recording layer is subjected to magnetization reversal by applying a write current to the heavy metal layer, and data is written. As described above, in the magnetic memory of PTL 2, a MTJ in which data is to be written can be selected by applying the voltage to the MTJ.

CITATION LIST

Patent Literature

PTL 1: JP-A-2014-179447
PTL 2: JP-A-2017-112351

SUMMARY OF INVENTION

Technical Problem

However, a write efficiency of the SOT-MRAM element using a general heavy metal is as small as approximately ½ of a write efficiency of the STT-MRAM element, and it is necessary to improve the write efficiency. For this reason, the improvement in the write efficiency of the SOT-MRAM element has been required.

Therefore, the invention has been made in consideration of the problems described above, and an object thereof is to provide a magnetic stacked film that is capable of improving a write efficiency, and a magnetic memory element and a magnetic memory using the magnetic stacked film.

Solution to Problem

A magnetic stacked film according to the invention is a stacked film for a magnetic memory element, and includes: a heavy metal layer that contains β phase $W_{1-x}Ta_x$ ($0.00 < x \leq 0.30$); and a recording layer that includes a ferromagnetic layer having a reversible magnetization direction and is adjacent to the heavy metal layer, in which a thickness of the heavy metal layer is 2 nm or more and 8 nm or less.

A magnetic stacked film according to the invention is a stacked film for a magnetic memory element, and includes: a heavy metal layer that contains α phase $W_{1-x}Ta_x$ ($0.08 \leq x \leq 0.43$); and a recording layer that includes a ferromagnetic layer having a reversible magnetization direction and is adjacent to the heavy metal layer.

A magnetic memory element according to the invention, includes: the magnetic stacked film described above; a barrier layer that is adjacent to the recording layer; and a reference layer that is adjacent to the barrier layer and has a fixed magnetization direction, in which the magnetization direction of the ferromagnetic layer of the recording layer is reversed by a write current to be applied to the heavy metal layer.

A magnetic memory according to the invention, includes: the magnetic memory element described above; a write unit that includes a write power supply writing data in the magnetic memory element by applying the write current to the heavy metal layer; and a read unit that includes a read power supply applying a read current penetrating through the barrier layer, and a current detector reading data written in the magnetic memory element by detecting the read current that penetrates through the barrier layer.

Advantageous Effects of Invention

According to the invention, a heavy metal layer contains β phase $W_{1-x}Ta_x$ (0.00<x≤0.30) or α phase $W_{1-x}Ta_x$ (0.08≤x≤0.43), and thus, a spin generating efficiency of a magnetic stacked film is higher than that of the related art, and therefore, a write current density can be decreased, and a write efficiency can be improved.

BRIEF DESCRIPTION OF DRAWINGS

DESCRIPTION OF EMBODIMENTS (1) First Embodiment (1-1) Overall Configuration of Magnetic Stacked Film of First Embodiment Hereinafter, a magnetic stacked film 1 of an embodiment of the invention will be described with reference to FIG. 1A and FIG. 1B. FIG. 1A is a perspective view illustrating a magnetic memory element 100 that is prepared by using the magnetic stacked film 1. The magnetic memory element 100 is a perpendicular magnetization type SOT-MRAM element in which magnetization directions of a ferromagnetic layer 18 of a recording layer 10 and a ferromagnetic layer 14 and a ferromagnetic layer 16 of a reference layer 12 are a perpendicular direction with respect to a film surface. Herein, as illustrated in FIG. 1A, a longitudinal direction of a heavy metal layer 2 (a direction in which a write current described below is applied) is set to an x direction (an upper right direction of the paper is set to a +x direction), a transverse direction is set to a y direction (in a perspective view, an upper left direction of the paper is set to a +y direction), and a perpendicular direction with respect to the surface of the heavy metal layer 2 is set to a z direction (an upper direction of the paper is set to a +z direction). In addition, FIG. 1B is a schematic view illustrating a sectional surface of the magnetic memory element 100 in the y direction. Herein, the +z direction, for example, is also referred to as an upper side, an upper portion, and the like, and a −z direction, for example, is also referred to as a lower side, a lower portion, and the like.

As illustrated in FIG. 1A, the magnetic stacked film 1 includes the heavy metal layer 2 that contains a β phase tungsten-tantalum alloy (hereinafter, represented as β phase $W_{1-x}Ta_x$, here, X is an atomic ratio), and the recording layer 10 that is provided adjacent to the heavy metal layer 2. In this embodiment, the heavy metal layer 2 has a rectangular parallelepiped shape that is stretched in a first direction (the x direction), and has a rectangular shape when seen from an upper surface. A film thickness of the heavy metal layer 2 (a length in the z direction) may be 2 nm or more and 8 nm or less, and may be preferably 2 nm or more and 5 nm or less. A diffusion length of an electron spin is approximately 1 nm, and thus, it is desirable that the film thickness is 2 nm or more. In addition, since β phase $W_{1-x}Ta_x$ having a composition described below can be formed, it is desirable that the film thickness is 8 nm or less, and is preferably 5 nm or less.

Figure 1A:
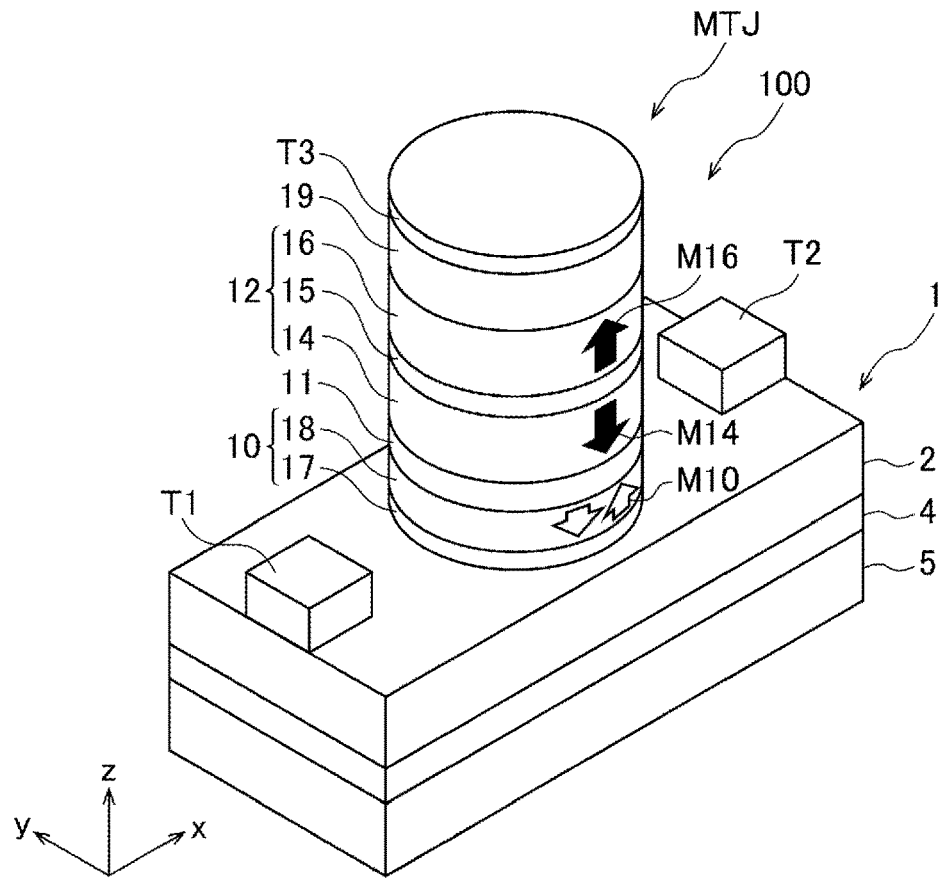
FIG. 1A is a perspective view illustrating a magnetic memory element of a first embodiment of the invention.

It is desirable that the heavy metal layer 2 has a rectangular shape in which a length (a length in the x direction) is approximately 10 nm or more and 260 nm or less, and a width (a length in the y direction) is approximately 5 nm or more and 150 nm or less. In this embodiment, the heavy metal layer 2 is set such that the width of the heavy metal layer 2 in the y direction is larger than the width of the recording layer 10.

The length of the heavy metal layer 2 may be minimized insofar as a current can be applied, and thus, it is possible to increase the density of the magnetic memory at the time of preparing the magnetic memory by using the magnetic memory element 100. It is desirable that the width of the heavy metal layer 2 is identical to the width of a MTJ, and thus, a write efficiency of the magnetic memory element 100 using the magnetic stacked film 1 is most excellent. It is desirable that the shape of the heavy metal layer 2 is set as described above, but is not particularly limited. Note that, the length of the heavy metal layer 2 is a desired length at the time of providing the recording layer 10 including one heavy metal layer 2, but is not limited thereto in a case where one heavy metal layer 2 includes a plurality of recording layers 10, and a plurality of MTJs are arranged in the first direction, that is, in a case where a plurality of magnetic memory elements 100 share one heavy metal layer 2.

The heavy metal layer 2 contains β phase $W_{1-x}Ta_x$ having an A15 structure and has conductivity. The composition of β phase $W_{1-x}Ta_x$ is 0.00<X≤0.30, is preferably 0.10≤X≤0.28, is more preferably 0.17≤X≤0.25, and is even more preferably 0.20≤X≤0.25. The heavy metal layer 2 contains β phase $W_{1-x}Ta_x$ having such a composition, and thus, a spin generating efficiency ($\theta_{SH}$) is improved, compared to a magnetic stacked film of the related art in which a heavy metal layer contains β phase tungsten or platinum and β phase tantalum, and therefore, a spin reversal efficiency can be improved. The spin generating efficiency is inversely proportional to a write current density, and thus, in a case where the spin generating efficiency increases, the write current density can be decreased, and the write efficiency of the magnetic memory element 100 using the magnetic stacked film 1 can be improved. In addition, the specific resistance of β phase $W_{1-x}Ta_x$ is 160 to 200 μΩcm, which is lower than the specific resistance (approximately 300 μΩcm) of β phase tantalum or the like of the related art, and thus, a voltage drop in the heavy metal layer 2 due to a read current can be reduced, and a read delay of the magnetic memory element 100 can be suppressed. Note that, apart of the heavy metal layer 2 containing β phase $W_{1-x}Ta_x$ may be amorphous.

In this embodiment, such a heavy metal layer 2, for example, is provided on a substrate 5 containing Si, $SiO_2$, or the like. On one surface of the substrate 5, for example, a buffer layer 4 that contains Ta or the like and has a thickness of approximately 0.5 nm to 7.0 nm is provided. The heavy metal layer 2 is provided adjacent to the buffer layer 4. The substrate 5 may be a circuit substrate such as a substrate on which a FET type transistor, metal wiring, or the like is formed. In this case, a through hole is provided in the buffer layer 4 such that the heavy metal layer 2 is brought into contact with the wiring or the like formed on the substrate 5.

The recording layer 10 is formed adjacent to the surface of the heavy metal layer 2 on a side opposite to the surface that is adjacent to the buffer layer 4, and includes a hafnium layer (hereinafter, referred to as a Hf layer) 17 that is adjacent to the heavy metal layer 2, and the ferromagnetic layer 18 that is formed adjacent to the Hf layer 17 and has a reversible magnetization direction. The thickness of the recording layer 10 is 0.8 nm to 5.0 nm, and is desirably 1.0 nm to 3.0 nm. In this embodiment, the recording layer 10 is formed into a columnar shape, but the shape of the recording layer 10 is not limited.

Figure 1B:
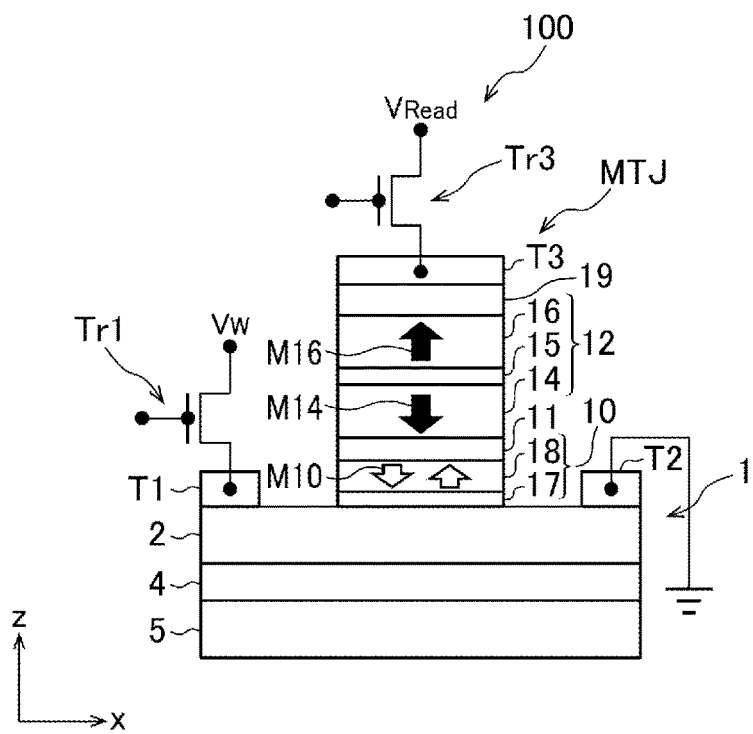
FIG. 1B is a schematic view illustrating a sectional surface of the magnetic memory element in FIG. 1A that is cut in an x direction.

The ferromagnetic layer 18 is a ferromagnetic film including a ferromagnetic body. The material and the thickness of the ferromagnetic layer 18 are selected in consideration of the material and a thickness of a barrier layer 11 described below such that interface magnetic anisotropy occurs on the interface between the ferromagnetic layer 18 and the barrier layer 11 at the time of preparing the magnetic memory element 100. For this reason, the ferromagnetic layer 18 is magnetized in a perpendicular direction with respect to the film surface (hereinafter, simply referred to as a perpendicular direction) by the interface magnetic anisotropy that occurs on the interface between the ferromagnetic layer 18 and the barrier layer 11. In FIG. 1A and FIG. 1B, the magnetization of the ferromagnetic layer 18 is represented by a void arrow as M10, and the direction of the arrow indicates a magnetization direction. Drawing two arrows of an arrow in an upper direction and an arrow in a lower direction on the ferromagnetic layer 18 indicates that the ferromagnetic layer 18 can be subjected to magnetization reversal in a direction perpendicular to the film surface. Note that, in practice, there may be components that are not directed to the magnetization direction (the direction of the arrow). Hereinafter, the same applies to a case where the magnetization is represented by an arrow in the drawings of this specification. In addition, the magnetization of the recording layer 10 indicates the magnetization M10 of the ferromagnetic layer 18.

As described above, in order to cause the interface magnetic anisotropy in the ferromagnetic layer 18, it is desirable that the ferromagnetic layer 18 contains CoFeB, FeB, or CoB. Note that, the ferromagnetic layer 18 can also be a multi-layer film, and in such a case, the ferromagnetic layer 18 has a configuration in which a CoFeB layer, a FeB layer, or a CoB layer is disposed on the interface between the ferromagnetic layer 18 and the barrier layer 11 described below, such as MgO, and a multi-layer film including a Co layer, such as a Co/Pt multi-layer film, a Co/Pd multi-layer film, and a Co/Ni multi-layer film, a regular alloy such as Mn—Ga, Mn—Ge, and Fe—Pt, an alloy containing Co, such as Co—Pt, Co—Pd, Co—Cr—Pt, Co—Cr—Ta—Pt, CoFeB, FeB, and CoB, and the like are inserted between the Hf layer 17 and the CoFeB layer, the FeB layer, or the CoB layer. The number of multi-layer films and alloys to be stacked, film thicknesses of the multi-layer film and the alloy are suitably adjusted in accordance with the size of the MTJ. Note that, the ferromagnetic layer 18 may be a multi-layer film in which a ferromagnetic layer and a non-magnetic layer are alternately stacked, and for example, may have a three-layer structure of a ferromagnetic layer/a non-magnetic layer/a ferromagnetic layer in which the magnetizations of two ferromagnetic layers are bonded by an interlayer interaction. In this case, the non-magnetic layer includes a non-magnetic body such as Ta, W, Mo, Pt, Pd, Ru, Rh, Ir, Cr, Au, Cu, Os, and Re.

The ferromagnetic layer 18 of the recording layer 10 is magnetized in the perpendicular direction by the interface magnetic anisotropy, but an easy axis of magnetization may be generated in the perpendicular direction by magnetic crystalline anisotropy or shape magnetic anisotropy, and the ferromagnetic layer 18 may be magnetized in the perpendicular direction. In this case, it is desirable that the ferromagnetic layer 18, for example, is an alloy containing at least one or more of Co, Fe, Ni, and Mn. In the detailed description, an alloy such as Co—Pt, Co—Pd, Co—Cr—Pt, and Co—Cr—Ta—Pt is desirable as an alloy containing Co, and in particular, it is desirable that such an alloy is so-called Co-rich in which more Co is contained than the other elements. An alloy such as Fe—Pt and Fe—Pd is desirable as an alloy containing Fe, and in particular, it is desirable that such an alloy is so-called Fe-rich in which more Fe is contained than the other elements. An alloy such as Co—Fe, Co—Fe—Pt, and Co—Fe—Pd is desirable as an alloy containing Co and Fe. The alloy containing Co and Fe may be Co-rich or may be Fe-rich. An alloy such as Mn—Ga and Mn—Ge is desirable as an alloy containing Mn. In addition, an element such as B, C, N, O, P, Al, and Si may be slightly contained in the alloy containing at least one or more of Co, Fe, Ni, and Mn, described above.

In a case where MgO is stacked on an amorphous metal layer, a MgO (100) barrier layer 11 is easily formed adjacent to the ferromagnetic layer 18 by properties in which a MgO layer that dominantly contains monocrystals oriented in a (100) direction is formed, and thus, it is desirable that the ferromagnetic layer 18 is an amorphous layer. As described above, the barrier layer 11 containing MgO (100) can be epitaxially grown as a (100) highly oriented film on the amorphous ferromagnetic body even in an in-plane direction by large grains, in-plane homogeneity of the orientation of MgO (100) can be improved, and the homogeneity of a resistance change rate (an MR change rate) can be improved.

The Hf layer 17 is provided adjacent to the ferromagnetic layer 18. The Hf layer 17 is a thin film containing hafnium (Hf). Note that, the Hf layer 17 may contain zirconium (Zr). The recording layer 10 includes the Hf layer 17, and thus, an increase in saturation magnetization Ms of the ferromagnetic layer 18 due to a heat treatment described below can be suppressed, and as a result thereof, an increase in the write current density can also be suppressed, and thus, a write efficiency of the recording layer 10 can be improved. In addition, the magnetization of the ferromagnetic layer 18 is reduced by inserting the Hf layer 17, and thus, the size of a diamagnetic field decreases, perpendicular magnetic anisotropy increases, and magnetization is easily performed in the perpendicular direction. For this reason, perpendicular magnetization can be performed up to a point at which the ferromagnetic layer is thicker, and thus, thermal stability of the ferromagnetic layer 18 can be improved. It is preferable that the Hf layer 17 is formed such that the thickness is 0.2 nm or more and 0.7 nm or less, and is more preferably 0.3 nm or more and 0.7 nm or less. In order to form the Hf layer 17 into the shape of a layer, a thickness of approximately 0.2 nm is required, and in even in a case where the thickness of the Hf layer 17 is greater than 0.7 nm, an increase rate of the spin generating efficiency is saturated, and the write efficiency is not considerably improved.

In a case where the ferromagnetic layer 18 includes a ferromagnetic body containing boron (B), for example, such a Hf layer 17 has a considerable effect in a case where the ferromagnetic layer 18 contains CoFeB, FeB, or CoB or includes a ferromagnetic body containing the alloy described above. For this reason, in a case where the ferromagnetic layer 18 contains CoFeB, FeB, or CoB, it is particularly preferable that the Hf layer 17 is inserted. In a case where the ferromagnetic layer 18 has a multi-layer structure, it is preferable that the ferromagnetic layer adjacent to the Hf layer 17 contains CoFeB, FeB, or CoB. Note that, the recording layer 10 may not include the Hf layer 17.

In this embodiment, for example, the buffer layer 4, the heavy metal layer 2, the Hf layer 17, and the ferromagnetic layer 18 are formed on the substrate 5 in this order by film formation using a general film formation method such as a physical vapor deposition (PVD), and thus, the magnetic stacked film 1 is formed. The heavy metal layer 2, for example, is formed by alternately stacking an extremely thin tungsten film of approximately 0.32 nm, and for example, an extremely thin tantalum film of approximately 0.16 nm. The tungsten/tantalum stacked film becomes a β phase $W_{1-x}Ta_x$ layer by the heat treatment at the time of preparing the magnetic memory element 100 described below. The same applies to the formation according to simultaneous film formation and film formation using an alloy target. The composition of the β phase $W_{1-x}Ta_x$ layer can be adjusted by suitably changing the thicknesses of the tungsten film and the tantalum film, by changing the composition of the target, by changing a film formation rate, or the like. Note that, for explanatory convenience, the tungsten "film" is noted, but it may not be necessary that the film is formed on the entire surface. In addition, the recording layer 10 is molded by a known lithography technology.

(1-2) Magnetic Memory Element Using Magnetic Stacked Film of First Embodiment

Next, the magnetic memory element 100 using the magnetic stacked film 1 of the first embodiment will be described with reference to FIG. 1A and FIG. 1B. The magnetic memory element 100 is a SOT-MRAM element type magnetic memory element provided with a MTJ including the recording layer 10 of the magnetic stacked film 1, the barrier layer 11, and the reference layer 12, adjacent to the heavy metal layer 2. In this embodiment, the MTJ is in a columnar shape, in accordance with the shape of the recording layer 10, but the shape of the MTJ is not limited.

The heavy metal layer 2 and the recording layer 10 of the magnetic memory element 100 have been described above, and thus, the description thereof will be omitted. The barrier layer 11 is formed adjacent to the ferromagnetic layer 18 of the recording layer 10. It is desirable that the barrier layer 11 includes an insulating body such as MgO, $Al_2O_3$, AlN, and MgAlO, in particular, MgO. In addition, the thickness of the barrier layer 11 is 0.1 nm to 2.5 nm, and is desirably 0.5 nm to 1.5 nm.

The reference layer 12 is a three-layer stacked film in which the ferromagnetic layer 14, a non-magnetic layer 15, and the ferromagnetic layer 16 are stacked on the barrier layer 11 in this order, and has a three-layer stacked ferri structure. For this reason, the direction of magnetization M14 of the ferromagnetic layer 14 and the direction of magnetization M16 of the ferromagnetic layer 16 are antiparallel to each other, the magnetization M14 is directed to the −z direction, and the magnetization M16 is directed to the +z direction. Herein, a case where the magnetization directions are antiparallel to each other indicates that the magnetization directions are different from each other by approximately 180 degrees, a case where the magnetization is directed to the +z direction indicates the upper direction, and a case where the magnetization is directed to the −z direction indicates the lower direction.

In this embodiment, the material and the thickness of the ferromagnetic layer 14 are selected such that the interface magnetic anisotropy occurs on the interface between the ferromagnetic layer 14 closest to the barrier layer 11 side and the barrier layer 11 in the reference layer 12, and thus, the magnetization direction of the ferromagnetic layer 14 becomes the perpendicular direction with respect to the film surface. Then, as described above, the reference layer 12 has the stacked ferri structure, and the magnetization M14 and the magnetization M16 are fixed in the perpendicular direction by antiferromagnetically bonding the magnetization M14 of the ferromagnetic layer 14 and the magnetization M16 of the ferromagnetic layer 16. As described above, the magnetization of the reference layer 12 is fixed in the perpendicular direction. Note that, the magnetization M14 of the ferromagnetic layer 14 and the magnetization M16 of the ferromagnetic layer 16 are antiferromagnetically bonded by the interlayer interaction such that the magnetization direction is fixed, and thus, the directions of the magnetization M14 and the magnetization M16 may be fixed in the perpendicular direction.

In this embodiment, the magnetization M14 is fixed in the lower direction, and the magnetization M16 is fixed in the upper direction, but the magnetization M14 may be fixed in the upper direction, and the magnetization M16 may be fixed in the lower direction. Further, the magnetization directions of the ferromagnetic layer 14 and the ferromagnetic layer 16 are set to the perpendicular direction by the magnetic crystalline anisotropy or the shape magnetic anisotropy, and the magnetization M14 of the ferromagnetic layer 14 and the magnetization M16 of the ferromagnetic layer 16 are antiferromagnetically bonded by the interlayer interaction such that the magnetization direction is fixed, and thus, the directions of the magnetization M14 and the magnetization M16 may be fixed in the perpendicular direction.

The ferromagnetic layer 14 and the ferromagnetic layer 16 are capable of containing the same material as that of the recording layer 10, and the non-magnetic layer 15 is capable of containing Ir, Rh, Ru, Os, Re, or an alloy thereof. The non-magnetic layer 15 is formed to have a thickness of approximately 0.5 nm to 1.0 nm in the case of Ru, of approximately 0.5 nm to 0.8 nm in the case of Ir, of approximately 0.7 nm to 1.0 nm in the case of Rh, of approximately 0.75 nm to 1.2 nm in the case of Os, and of approximately 0.5 nm to 0.95 nm in the case of Re. For example, the reference layer 12 includes the ferromagnetic layer 14: CoFeB (1.5 nm)/Ta (0.4 nm)/Co (0.6 nm)/(Pt (0.8 nm)/Co (0.25 nm))$_3$/Pt (0.8 nm)/Co (1.0 nm) from the barrier layer 11 side, the non-magnetic layer 15: Ru (0.85 nm), and the ferromagnetic layer 16: Co (1.0 nm)/(Pt 0.8 nm/Co 0.25 nm)$_{13}$ from the non-magnetic layer side, and the ferromagnetic layer 14 includes Co—Fe—B, and thus, the magnetization direction of the ferromagnetic layer 14 can be set to the perpendicular direction by the interface magnetic anisotropy. Note that, the number "$_3$" after the parenthesis in "(Pt (0.8 nm)/Co (0.25 nm))$_3$" indicates that a two-layer film of Pt (0.8 nm)/Co (0.25 nm) is repeatedly stacked three times (that is, a total of six-layer film). The same applies to "$_{13}$" in "(Pt 0.8 nm/Co 0.25 nm)$_{13}$".

As described above, the ferromagnetic layer 14, for example, may be a three-layer film in which an amorphous ferromagnetic layer containing CoFeB, FeB, CoB, or the like (approximately 0.6 nm to 2.0 nm), a non-magnetic layer containing Ta, W, Mo, or the like (1.0 nm or less), and a ferromagnetic layer are stacked on the barrier layer 11 in this order. The amorphous ferromagnetic layer and the ferromagnetic layer of the ferromagnetic layer 14 are ferromagnetically bonded by the interlayer interaction. The ferromagnetic layer 14, for example, includes the amorphous ferromagnetic layer: Co—Fe—B (1.5 nm)/the non-magnetic layer: Ta (0.5 nm)/the ferromagnetic layer: a crystalline ferromagnetic layer having perpendicular magnetic anisotropy. Accordingly, a magnetization direction of the amorphous ferromagnetic layer becomes the perpendicular direction, and a magnetization direction of the ferromagnetic layer facing the amorphous ferromagnetic layer through the non-magnetic layer also becomes the perpendicular direction, and thus, the magnetization direction of the ferromagnetic layer 14 can be set to the perpendicular direction.

A cap layer 19, for example, is a layer of approximately 1.0 nm that contains a conductive material such as Ta, and is formed adjacent to the reference layer 12. Note that, the magnetic memory element 100 may not include the cap layer 19. In addition, the cap layer 19 may include a non-magnetic layer such as MgO. In this case, for example, the cap layer 19 is set such that a tunnel current is applied, and thus, a current is applied to the reference layer 12 from a third terminal T3.

For example, the barrier layer 11, the reference layer 12, and the cap layer 19 are stacked on the recording layer 10 of the magnetic stacked film 1 in this order by a general film formation method such as a physical vapor deposition (PVD), and after that, the heat treatment is performed at a temperature of approximately 300° C. to 400° C., and thus, the magnetic memory element 100 is prepared. Note that, the recording layer 10, the barrier layer 11, the reference layer 12, and the cap layer 19 are formed on the entire surface of the heavy metal layer 2 in this order, and the MTJ is molded by a lithography technology or the like, and thus, the magnetic memory element 100 may be prepared.

Three terminals (a first terminal T1, a second terminal T2, and a third terminal T3) for performing a write operation or a read operation by applying a voltage or by applying a current are connected to the magnetic memory element 100. The magnetic memory element 100 is a three-terminal element. The first terminal T1, the second terminal T2, and the third terminal T3, for example, are a member containing a metal having conductivity, such as Cu, Al, and Au, and the shape thereof is not particularly limited.

The first terminal T1 and the second terminal T2 are provided in one end portion and the other end portion of the heavy metal layer 2 such that the MTJ is disposed between both of the terminals. In this embodiment, the first terminal T1 is provided on the surface of the one end portion of the heavy metal layer 2 in the first direction, and the second terminal T2 is provided on the surface of the other end portion of the heavy metal layer 2 in the first direction. A FET type first transistor Tr1 is connected to the first terminal T1, and the second terminal T2 is connected to a ground. In the first transistor Tr1, for example, a drain is connected to the first terminal T1, a source is connected to a first bit line BL1 described below to be connected to a write power supply that supplies a write voltage $V_w$, and a gate is connected to a word line WL (refer to FIG. 4).

The write power supply is capable of setting a voltage level to the write voltage $V_w$ through the first bit line BL1, and is capable of applying the write voltage $V_w$ to the first terminal T1 by turning on the first transistor Tr1, and thus, a write current Iw according to the value of the write voltage $V_w$ is applied between the first terminal T1 and the second terminal T2. For example, the write current Iw is applied to the second terminal T2 from the first terminal T1 by setting the value of the write voltage $V_w$ to be higher than the ground, and the write current Iw is applied to the first terminal T1 from the second terminal T2 by setting the value of the write voltage $V_w$ to be lower than the ground. As described above, the first terminal T1 and the second terminal T2 are connected to (the one end portion and the other end portion of) the heavy metal layer 2, and the write current Iw for reversing the magnetization direction of the recording layer 10 is applied to the heavy metal layer 2.

The third terminal T3 is provided on the cap layer 19 in contact with the cap layer 19. In this embodiment, the third terminal T3 is a columnar thin film in which a sectional surface shape cut in the in-plane direction is a circular shape that is identical to that of the MTJ, is disposed on the upper surface of the MTJ (the cap layer 19) to cover the entire upper surface, and is electrically connected to the reference layer 12 through the cap layer 19. In addition, in this embodiment, a FET type third transistor Tr3 is connected to the third terminal T3. In the third transistor Tr3, for example, a drain is connected to the third terminal T3, a source is connected to a second bit line BL2 to be connected to a read power supply that supplies a read voltage $V_{Read}$, and a gate is connected to a read voltage line RL (refer to FIG. 4). The read power supply is capable of setting a voltage level to the read voltage $V_{Read}$ through the second bit line BL2, and is capable of applying the read voltage $V_{Read}$ to the third terminal T3 by turning on the third transistor Tr3.

The first transistor Tr1 and the third transistor Tr3 are turned on, and thus, a read current Ir for reading out a resistance value of the MTJ in accordance with a potential difference between the first terminal T1 and the third terminal T3 is applied between the first terminal T1 and the third terminal T3. For example, the read current Ir can be applied to the third terminal T3 from the first terminal T1 through the heavy metal layer 2 and the MTJ by setting $V_w$ to be higher than $V_{Read}$.

Figure 1C:
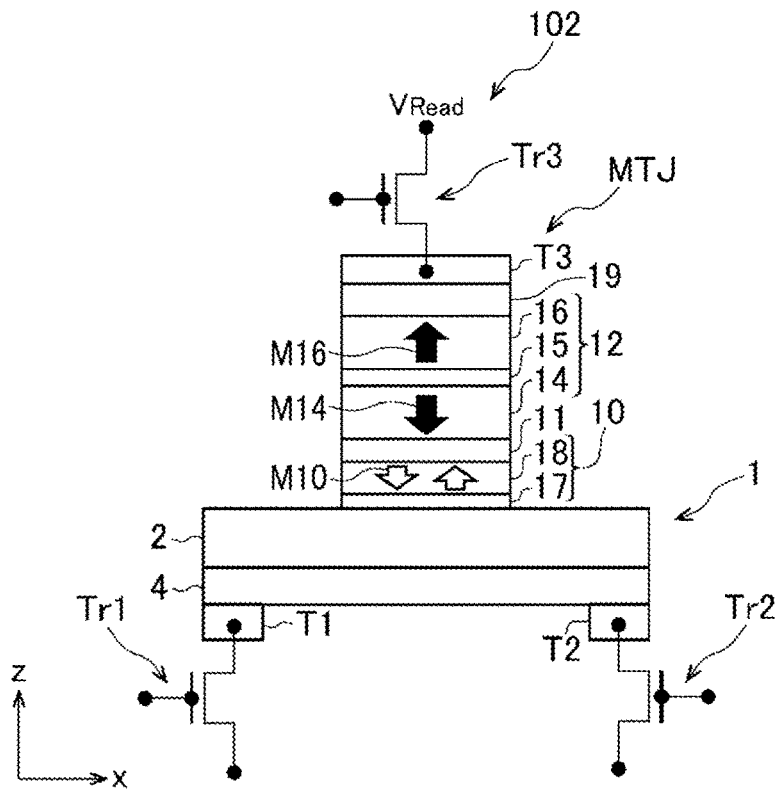
FIG. 1C is a schematic sectional view illustrating an example of a magnetic memory element in which a first terminal and a second terminal are provided in a lower portion of a heavy metal layer.

In this embodiment, the first terminal T1 and the second terminal T2 are provided in the upper portion of the heavy metal layer 2 (the surface on which the MTJ is provided), and a contact is formed from the upper side to the magnetic memory element 100, but the invention is not limited thereto. For example, as with a magnetic memory element 102 illustrated in FIG. 1C, the first terminal T1 and the second terminal T2 may be provided adjacent to the buffer layer 4 provided in the lower portion of the heavy metal layer 2 (adjacent to the surface on the backside of the surface on which the MTJ is provided), and a contact may be formed from the lower side to the magnetic memory element 102. In addition, as with the magnetic memory element 102 illustrated in FIG. 1C, the second terminal T2, for example, may be connected to a third bit line (not illustrated in FIG. 1C) but not the ground through a second transistor Tr2, and a direction in which the write current Iw is applied may be changed in accordance with a potential difference between the first terminal T1 and the second terminal T2 connected to the first bit line BL1 (not illustrated in FIG. 1C). In this case, for example, the write current Iw is applied to the second terminal T2 from the first terminal T1 by setting the first bit line BL1 to a High level, by setting the third bit line to a Low level, and by setting the potential of the first terminal T1 to be higher than the potential of the second terminal T2. Then, the write current Iw is applied to the first terminal T1 from the second terminal T2 by setting the first bit line BL1 to the Low level, by setting the third bit line to the High level, and by setting the potential of the second terminal T2 to be higher than the potential of the first terminal T1. In addition, in the read, it is possible to set the read current not to be applied to the second terminal T2 by turning off the second transistor Tr2.

(1-3) Write Method and Read Method of Magnetic Memory Element

A write method of such a magnetic memory element 100 will be described with reference to FIG. 2A, FIG. 2B, FIG. 2C, and FIG. 2D in which the same reference numerals are applied to the same configurations as those in FIG. 1A and FIG. 1B. In the magnetic memory element 100, the resistance of the MTJ is changed in accordance with whether the magnetization directions of the recording layer 10 and the reference layer 12 are parallel to each other or antiparallel to each other. In practice, in the magnetic memory element 100, the reference layer 12 is a stacked film, and thus, the resistance of the MTJ is changed in accordance with whether the magnetization direction of the recording layer 10 and the magnetization direction of the ferromagnetic layer 14 of the reference layer 12 that is in contact with the barrier layer 11 are parallel to each other or antiparallel to each other. In addition, in a case where the recording layer 10 is also a stacked film, in the magnetic memory element 100, the resistance of the MTJ is changed in accordance with whether the magnetization direction of the ferromagnetic layer 18 of the recording layer 10 that is in contact with the barrier layer 11 and the magnetization direction of the ferromagnetic layer 14 of the reference layer 12 that is in contact with the barrier layer 11 are parallel to each other or antiparallel to each other.

Herein, a case where the recording layer 10 and the reference layer 12 are in a parallel state also includes a state in which the recording layer 10 or the reference layer 12 is a stacked film, and the magnetization direction of the ferromagnetic layer 18 of the recording layer 10 that is in contact with the barrier layer 11 and the magnetization direction of the ferromagnetic layer 14 of the reference layer 12 that is in contact with the barrier layer 11 are parallel to each other. Then, a case where the recording layer 10 and the reference layer 12 are in an anti-parallel state indicates a state in which the recording layer 10 or the reference layer 12 is a stacked film, and the magnetization direction of the ferromagnetic layer 18 of the recording layer 10 that is in contact with the barrier layer 11 and the magnetization direction of the ferromagnetic layer 14 of the reference layer 12 that is in contact with the barrier layer 11 are in an antiparallel to each other.

In the magnetic memory element 100, 1-bit data of "0" and "1" is assigned to the parallel state and the anti-parallel state by using the fact that the resistance value of the MTJ is different between the parallel state and the anti-parallel state, and thus, data is stored in the magnetic memory element 100. In the magnetic memory element 100, the recording layer 10 has a reversible magnetization direction, and thus, a magnetization state of the MTJ is transitioned between the parallel state and the anti-parallel state by reversing the magnetization direction of the recording layer 10, "1" is stored in a MTJ (hereinafter, also referred to as a bit) in which "0" is stored, and "0" is stored in a bit in which "1" is stored. Herein, as described above, changing the resistance value of the MTJ by reversing the magnetization direction of the recording layer 10 indicates writing data.

The write method of the magnetic memory element 100 will be described in more detail. In this embodiment, the heavy metal layer 2 contains β phase $W_{1-x}Ta_x$, and the sign of a spin hall angle is negative. Therefore, a case where the spin hall angle of the heavy metal layer 2 is negative will be described as an example. In addition, an external magnetic field $H_0$ can be applied in the x direction (the longitudinal direction of the heavy metal layer 2) by a magnetic field generating device that is not illustrated.

Figure 2A:
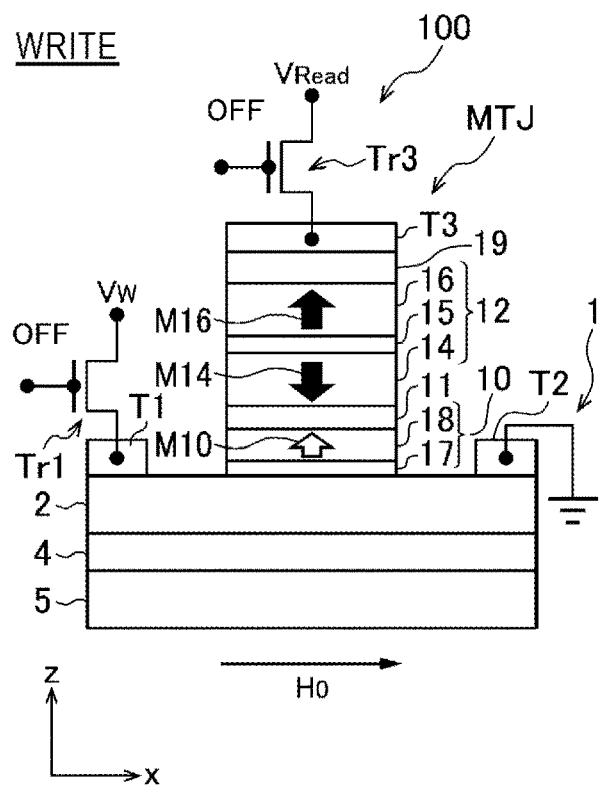
FIG. 2A is a schematic sectional view describing a method of writing data "0" in a magnetic memory element in which data "1" is stored, and illustrates an initial state.

First, a case where the data "0" is written in the magnetic memory element 100 in which the data "1" is stored will be described. In this case, in the initial state, as illustrated in FIG. 2A, the magnetic memory element 100 stores the data "1", the magnetization direction of the recording layer 10 is the upper direction, the magnetization direction of the ferromagnetic layer 14 of the reference layer 12 that is in contact with the barrier layer 11 is the lower direction, and the MTJ is in the anti-parallel state. Then, the first transistor Tr1 and the third transistor Tr3 are turned off. Initially, as illustrated in FIG. 2A, the external magnetic field $H_0$ is applied in the +x direction.

Figure 2B:
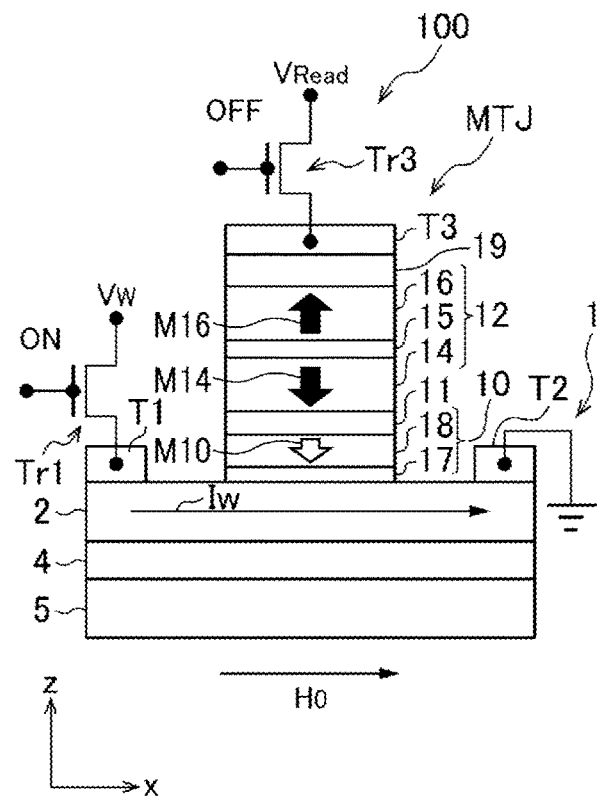
FIG. 2B is a schematic sectional view describing a method of writing data "0" in a magnetic memory element in which data "1" is stored, and illustrates a state in which data is written by applying a write current.

Next, as illustrated in FIG. 2B (in FIG. 2B, the magnetization direction of the recording layer 10 after the write is illustrated), the first transistor Tr1 is turned on, and the write voltage $V_w$ is applied to the first terminal T1. At this time, the write voltage $V_w$ is set to be higher than a ground voltage, and thus, the write current Iw is applied to the second terminal T2 from the first terminal T1 through the heavy metal layer 2, and the write current Iw is applied to the other end portion from the one end portion of the heavy metal layer 2 in the +x direction. The third transistor Tr3 is turned off, and thus, a current is not applied to the third terminal T3 from the first terminal T1 through the MTJ. In this embodiment, the write current Iw is applied between the one end portion and the other end portion of the heavy metal layer 2. The write current Iw is a pulse current, and a pulse width can be changed by adjusting a time for turning on the first transistor Tr1.

In a case where the write current Iw is applied to the heavy metal layer 2, in the heavy metal layer 2, a spin current (the flow of a spin angular movement) is generated by a spin hall effect of a spin orbit interaction, a spin directed to the near side of the paper (in FIG. 1A and FIG. 1B, the −y direction) is applied to the upper surface side of the heavy metal layer 2 (the +z direction), a spin directed to the deep side of the paper (in FIG. 1A and FIG. 1B, the +y direction) of which the direction is antiparallel to that of the spin described above is applied to the lower surface side of the heavy metal layer 2 (the −z direction), and the spins are unevenly distributed in the heavy metal layer 2. Then, the spin directed to the −y direction flows into the recording layer 10 by the spin current that is applied to the heavy metal layer 2.

At this time, in the ferromagnetic layer 18 of the recording layer 10, torque in the +x direction acts on the magnetization M10 by the spin that flows into the recording layer 10, the magnetization M10 is rotated by the torque in the +x direction, the magnetization M10 in the upper direction is reversed to the lower direction, and the MTJ is in the parallel state. At this time, the external magnetic field $H_0$ is applied in the +x direction, and thus, the torque of the spin is cancelled out by the external magnetic field $H_0$, the magnetization M10 is not further rotated, and the magnetization M10 is directed to the −z direction. After that, the write current is stopped by turning off the first transistor Tr1, and thus, the magnetization M10 is fixed in the −z direction, and the data "0" is stored.

Next, a case where the data "1" is written in the magnetic memory element 100 in which the data "0" is stored will be described.

Figure 2C:
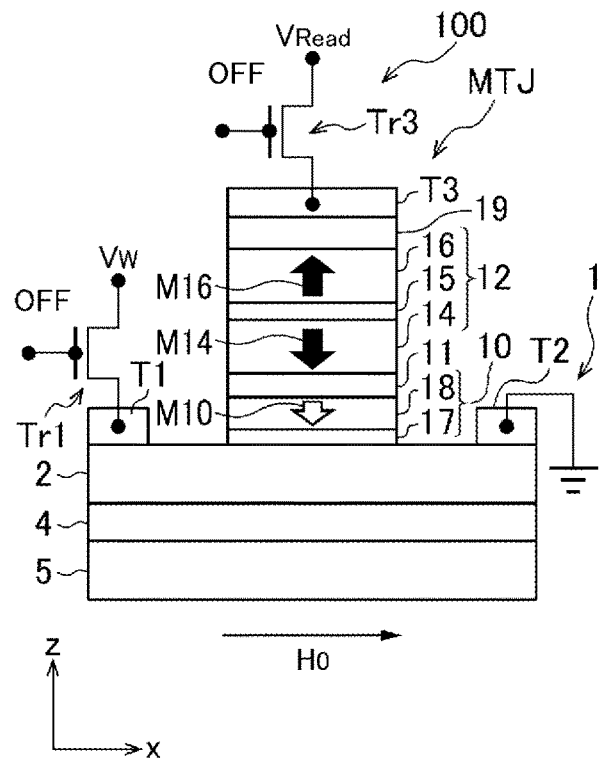
FIG. 2C is a schematic sectional view describing a method of writing data "1" in a magnetic memory element in which data "0" is stored, and illustrates an initial state.

In this case, in the initial state, the magnetic memory element 100 stores the data "0", the magnetization direction of the recording layer 10 is the lower direction, the magnetization direction of the ferromagnetic layer 14 of the reference layer 12 that is in contact with the barrier layer 11 is the lower direction, and the MTJ is in the parallel state. Then, the first transistor Tr1 and the third transistor Tr3 are turned off. Initially, as illustrated in FIG. 2C, the external magnetic field $H_0$ is applied in the +x direction.

Figure 2D:
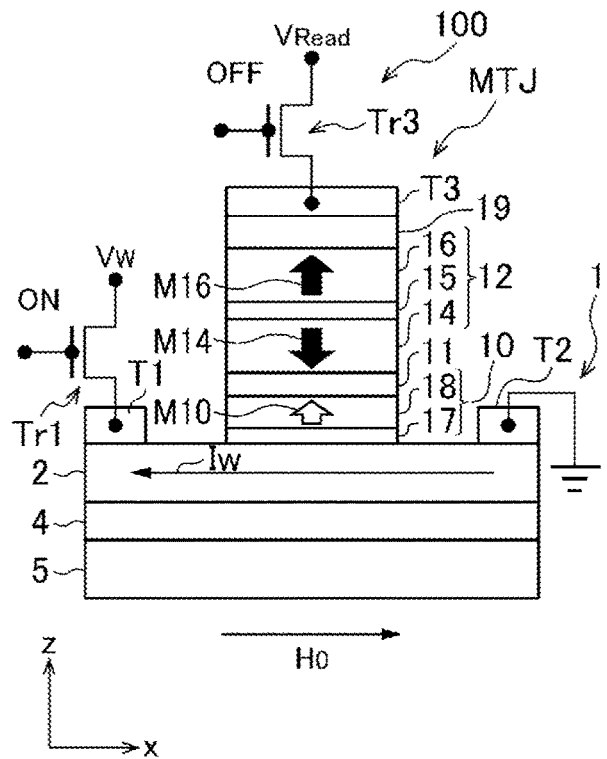
FIG. 2D is a schematic sectional view describing a method of writing data "1" in a magnetic memory element in which data "0" is stored, and illustrates a state in which data is written by applying a write current.

Next, as illustrated in FIG. 2D (in FIG. 2D, the magnetization direction of the recording layer 10 after the write is illustrated), the first transistor Tr1 is turned on, and the write voltage $V_w$ is applied to the third terminal T3. At this time, the write voltage $V_w$ is set to be lower than the ground voltage, and thus, the write current Iw is applied to the first terminal T1 from the second terminal T2 through the heavy metal layer 2, and the write current Iw is applied to the other end portion from the one end portion of the heavy metal layer 2 in the −x direction.

In a case where the write current Iw is applied to the heavy metal layer 2, in the heavy metal layer 2, the spin current (the flow of the spin angular movement) is generated by the spin hall effect of the spin orbit interaction, the spin directed to the deep side of the paper (in FIG. 1A and FIG. 1B, the +y direction) is applied to the upper surface side of the heavy metal layer 2 (the +z direction), the spin directed to the near side of the paper (in FIG. 1A and FIG. 1B, the −y direction) of which the direction is antiparallel to that of the spin described above is applied to the lower surface side of the heavy metal layer 2 (the −z direction), the spins are unevenly distributed in the heavy metal layer 2, and then, the spin directed to the +y direction flows into the recording layer 10 by the spin current that is applied to the heavy metal layer 2.

At this time, in the ferromagnetic layer 18 of the recording layer 10, torque in the −x direction acts on the magnetization M10 by the spin that flows into the recording layer 10, the magnetization M10 is rotated by the torque in the −x direction, the magnetization M10 in the lower direction is reversed to the upper direction, and the MTJ is in the anti-parallel state. At this time, the external magnetic field $H_0$ is applied in the +x direction, and thus, the torque of the spin is cancelled out by the external magnetic field $H_0$, the magnetization M10 is not further rotated, and the magnetization M10 is directed to the +z direction. After that, the write current is stopped by turning off the first transistor Tr1, and thus, the magnetization M10 is fixed in the +z direction, and the data "1" is stored. As described above, the write current Iw is applied to the heavy metal layer 2, and thus, data can be rewritten by performing the magnetization reversal with respect to the recording layer 10.

As described above, in the magnetic memory element 100, the write current Iw is applied between the one end portion and the other end portion of the heavy metal layer 2, and thus, the data "0" or the data "1" can be written by reversing the magnetization direction of the recording layer 10 of the MTJ.

In the magnetic memory element 100, the magnetic anisotropy of the ferromagnetic layer 18 of the recording layer 10 is reduced by applying a voltage between the one end portion (the first terminal T1) and the other end portion (the second terminal T2) of the heavy metal layer 2, by applying a write current to the heavy metal layer 2, and by applying the voltage to the MTJ through the third terminal T3, and thus, the magnetization M10 of the recording layer 10 may be subjected to the magnetization reversal by the spin that is injected from the heavy metal layer 2.

In the example described above, it has been described that the external magnetic field $H_0$ is applied in the x direction (the longitudinal direction of the heavy metal layer 2) by the magnetic field generating device, but exchange bonding in the x direction through β phase $W_{1-x}Ta_x$ may be used by applying a three-layer film of a ferromagnetic layer/a non-magnetic layer/a ferromagnetic layer that has an easy axis in the x direction and has in-plane magnetic anisotropy or a three-layer film of a ferromagnetic layer/a non-magnetic layer/a ferromagnetic layer that is antiferromagnetically bonded to the method of applying a voltage described above or under the heavy metal layer 2, and an external magnetic field generating device may not be required.

Figure 3:
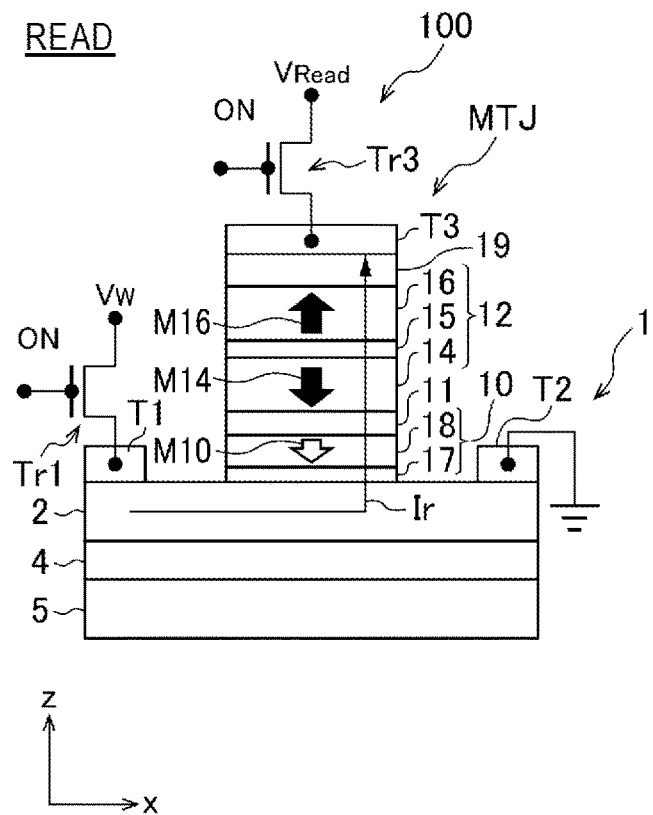
FIG. 3 is a schematic sectional view describing a read method of data that is stored in a magnetic memory element.

Subsequently, a read method will be described by using FIG. 3. At this time, in the initial state, all of the transistors are turned off. First, the write voltage $V_w$ is set to be higher than the read voltage $V_{Read}$. Next, in the read, the first transistor and the third transistor are turned on, the write voltage $V_w$ is applied to the first terminal T1, and the read voltage $V_{Read}$ is applied to the third terminal T3. At this time, the write voltage $V_w$ is set to be higher than the read voltage $V_{Read}$, and thus, the read current Ir is applied to the heavy metal layer 2, the recording layer 10, the barrier layer 11, the reference layer 12, the cap layer 19, and the third terminal T3 from the first terminal T1 in this order. The read current Ir is applied to penetrate through the barrier layer 11. The read current Ir is detected by a current detector that is not illustrated. The size of the read current Ir is changed in accordance with the resistance value of the MTJ, and thus, whether the MTJ is in the parallel state or in the anti-parallel state, that is, whether the MTJ stores the data "0" or stores the data "1" can be read from the size of the read current Ir. The read current Ir is a pulse current, and a pulse width is adjusted by adjusting a time for turning on the third transistor Tr3.

It is desirable that the read current Ir is set to a weak current such that the recording layer 10 is not subjected to spin injection magnetization reversal by the read current Ir when read current Ir is applied to the MTJ. The size of the read current Ir is adjusted by suitably adjusting a potential difference between the write voltage $V_w$ and the read voltage $V_{Read}$. In addition, it is desirable that the first transistor Tr1 is turned on such that the write voltage $V_w$ is turned on, and then, the third transistor Tr3 is turned on such that the read voltage $V_{Read}$ is turned on. By doing so, it is possible to prevent a current from being applied to the second terminal T2 from the third terminal T3 through the MTJ, and to prevent a current other than the read current from being applied to the MTJ.

After that, the third transistor Tr3 is turned off, and then, the first transistor Tr1 is turned off. The first transistor Tr1 is turned off after the third transistor Tr3 is turned off, that is, the write voltage $V_w$ is turned off after the read voltage $V_{Read}$ is turned off, and thus, it is possible to prevent a current according to a potential difference between the read voltage $V_{Read}$ and the ground voltage from being applied to the second terminal T2 from the third terminal T3 through the MTJ and the heavy metal layer 2. Accordingly, the magnetic memory element 100 is capable of protecting the barrier layer 11, is also capable of further decreasing the thickness of the barrier layer 11, and is also capable of suppressing Read disturbance in which the magnetization state of the recording layer 10 is changed in accordance with a current to be applied to the MTJ.

(1-4) Magnetic Memory Including Magnetic Memory Element of Invention

Figure 4:
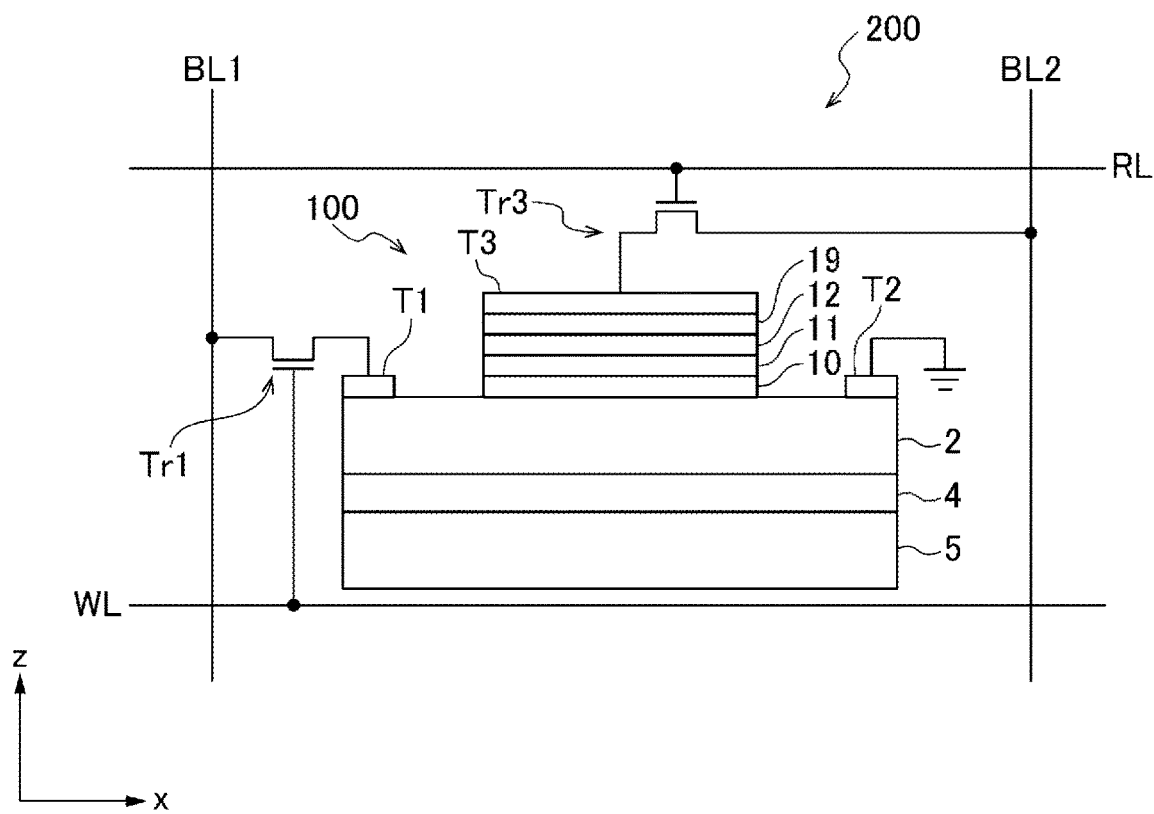
FIG. 4 is an example illustrating a circuit configuration of a magnetic memory cell circuit of one bit, using the magnetic memory element of the first embodiment of the invention.

Next, a configuration example of a magnetic memory cell circuit in which the magnetic memory element 100 having the configuration described above is used as a memory element will be described with reference to FIG. 4 in which the same reference numerals are applied to the same configurations as those in FIG. 1A and FIG. 1B. FIG. 4 illustrates the configuration of a magnetic memory cell circuit 200 of one bit. The magnetic memory cell circuit 200 includes the magnetic memory element 100 configuring a memory cell of one bit, the first bit line BL1, the second bit line BL2, the read voltage line RL, the word line WL, the first transistor Tr1, and the third transistor Tr3.

As described above, the magnetic memory element 100 has a three-terminal structure in which the first terminal T1 is connected to the upper surface of the one end portion of the heavy metal layer 2, the second terminal T2 is connected to the upper surface of the other end portion, and the third terminal T3 is connected to the upper surface of the cap layer 19. Note that, for explanatory convenience, in FIG. 4, the MTJ is illustrated by omitting each layer of the recording layer 10 and the reference layer 12.

The first terminal T1 is connected to the drain of the first transistor Tr1, the second terminal T2 is connected to the ground, and the third terminal T3 is connected to the drain of the third transistor Tr3. In the first transistor Tr1, the source is connected to the first bit line BL1, and the gate electrode is connected to the word line WL. In the third transistor Tr3, the source is connected to the second bit line BL2, and the gate electrode is connected to the read voltage line RL.

A method of writing data in the magnetic memory element 100 is as follows. First, in order to select the magnetic memory element 100, the word line WL is set to a High level. Then, the read voltage line RL is set to a Low level. On the other hand, the voltage (the write voltage $V_w$) of the first bit line BL1 is set to the High level or the Low level, in accordance with the data of a write target. Accordingly, the magnetic memory cell circuit 200 is selected, and the first transistor Tr1 is in an on state, and thus, the write operation is performed.

Specifically, in a case where the data "0" is written, the first bit line BL1 is set to the High level (a positive voltage). Accordingly, the write current Iw is applied to the second terminal T2 from the first terminal T1 (refer to FIG. 2B), and the data "0" is written. On the other hand, in a case where the data "1" is written, the first bit line BL1 is set to the Low level (a negative voltage). Accordingly, the write current Iw is applied to the first terminal T1 from the second terminal T2 (refer to FIG. 2D), and the data "1" is written.

A method of reading data that is stored in the magnetic memory element 100 is as follows. First, the voltage of the first bit line BL1 is set to the High level, and the voltage (the read voltage $V_{Read}$) of the second bit line BL2 is set to the Low level. Next, the word line WL is set to the High level such that the first transistor Tr1 is turned on, and then, the read voltage line RL is set to the High level such that the third transistor Tr3 is turned on, and thus, a voltage is applied to the MTJ. Accordingly, the magnetic memory cell circuit 200 is selected, and the read current Ir is applied to the third terminal T3 from the first terminal T1, and thus, the read operation is performed. That is, the read current Ir is applied to the second bit line BL2 that is set to the Low level from the first bit line BL1 that is set to the High level through the first terminal T1, the heavy metal layer 2, the recording layer 10, the barrier layer 11, the reference layer 12, the cap layer 19, and the third terminal T3. The size of the read current Ir is detected by the current detector, and thus, the size of the resistance of the MTJ, that is, the stored data can be determined and data can be read. Note that, the configuration or the circuit operation of the magnetic memory cell circuit 200 is an example, and can be suitably changed.

Figure 5:
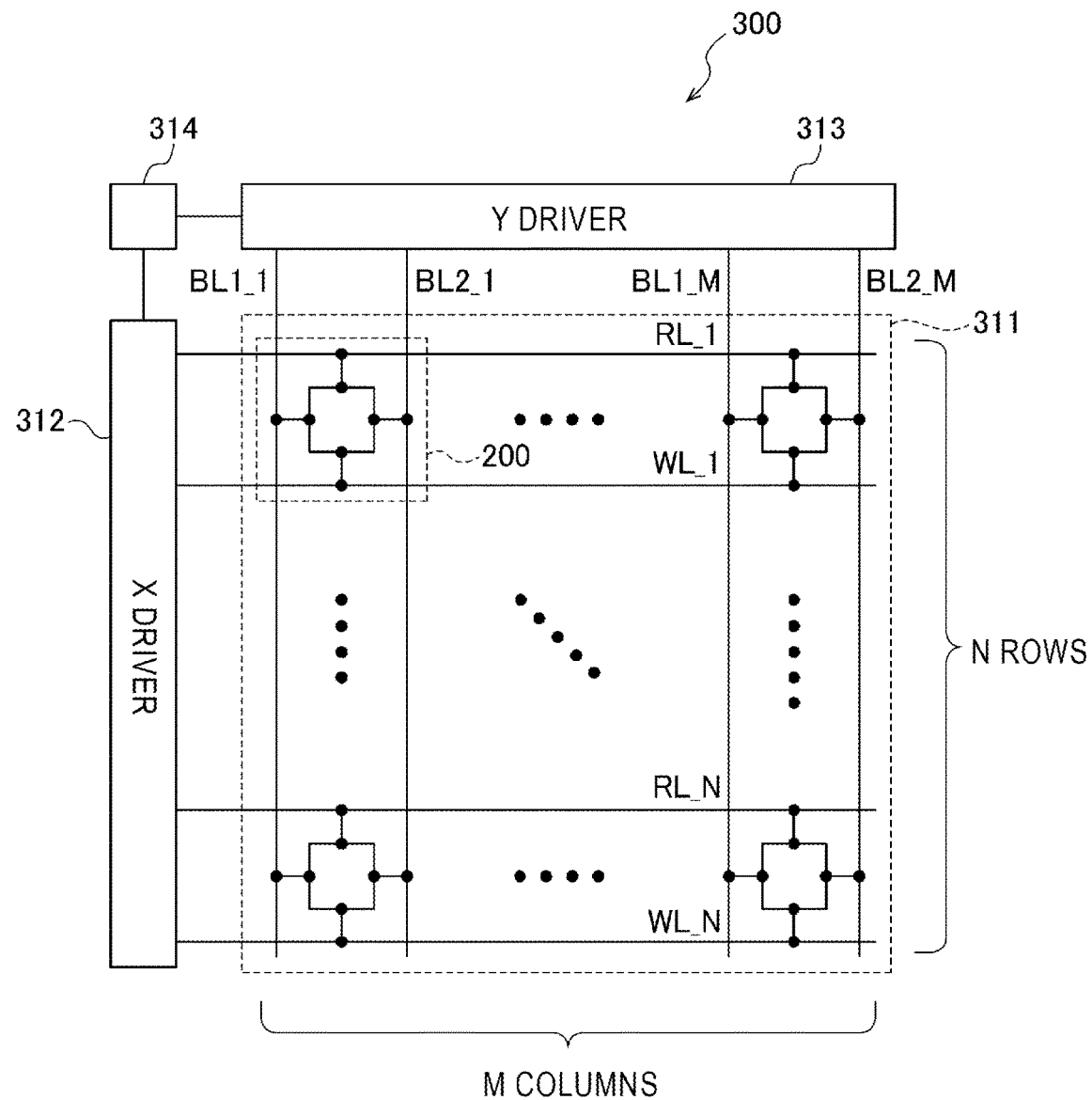
FIG. 5 is a block diagram of a magnetic memory in which a plurality of magnetic memory cell circuits illustrated in FIG. 4 are disposed.

Next, the configuration of a magnetic memory 300 including a plurality of magnetic memory cell circuits 200 exemplified in FIG. 4 will be described with reference to FIG. 5. As illustrated in FIG. 5, the magnetic memory 300 includes a memory cell array 311, an X driver 312, a Y driver 313, and a controller 314. The memory cell array 311 includes the magnetic memory cell circuits 200 that are disposed into the shape of an array of N rows and M columns. The magnetic memory cell circuit 200 in each column is connected to a pair of the first bit line BL1 and the second bit line BL2 in the corresponding column. In addition, the magnetic memory cell circuit 200 in each row is connected to the word line WL and the read voltage line RL in the corresponding row.

The X driver 312 is connected to a plurality of word lines WL and a plurality of read voltage lines RL, and decodes a row address that is received, and thus, drives the word line WL in a row that is an access target to the High level or the Low level, and drives the read voltage line RL to the High level or the Low level.

The Y driver 313 functions as a write unit that writes data in the magnetic memory element 100 and a read unit that reads data from the magnetic memory element 100. The Y driver 313 is connected to a plurality of first bit lines BL1 and a plurality of second bit lines BL2. The Y driver 313 decodes a column address that is received, and sets the first bit line BL1 and the second bit line BL2, connected to the magnetic memory cell circuit 200 that is an access target, to be in a data write state or a data read state.

In the write of the data "0", the Y driver 313 sets the first bit line BL1 connected to the magnetic memory cell circuit 200 that is a write target to the High level (a positive voltage). In addition, in the write of the data "1", the Y driver 313 sets the first bit line BL1 connected to the magnetic memory cell circuit 200 that is a write target to the Low level (a negative voltage). In the write, the X driver 312 sets the word line WL in a row to which the magnetic memory cell circuit 200 that is a write target belongs to the High level, and writes data in the MTJ of the magnetic memory cell circuit 200 that is a write target. Further, in the read of data that is stored in the magnetic memory cell circuit 200, the Y driver 313, first, sets the first bit line BL1 connected to the magnetic memory cell circuit 200 that is a read target to the High level, and sets the second bit line BL2 to the Low level. The X driver 312 sets the word line WL in a row to which the magnetic memory cell circuit 200 that is a read target belongs to the High level, and then, sets the read voltage line RL to the High level. Then, the Y driver 313 detects the read current Ir to be applied to the first bit line BL1 and the second bit line BL2 with the current detector, and determines the resistance state of the magnetic memory cell circuit 200 in each column by comparing the detected read current Ir with a reference value, and thus, reads the stored data.

The controller 314 controls each of the X driver 312 and the Y driver 313, in accordance with data write or data read.

(1-5) Action and Effect

In the configuration described above, the magnetic stacked film 1 of the first embodiment is a stacked film for a magnetic memory element and includes the heavy metal layer 2 that contains β phase $W_{1-x}Ta_x$ (0.00<x≤0.30), and the recording layer 10 that includes the ferromagnetic layer 18 having the reversible magnetization M10 and is adjacent to the heavy metal layer 2, in which the thickness of the heavy metal layer 2 is 2 nm or more and 8 nm or less.

Accordingly, in the magnetic stacked film 1, the heavy metal layer 2 contains β phase $W_{1-x}Ta_x$ (0.00<x≤0.30), and thus, the spin generating efficiency is higher than that of the magnetic stacked film of the related art that contains tungsten, platinum, or β phase tantalum, and thus, the write current density can be decreased, and the write efficiency of the magnetic memory element 100 can be improved. In addition, the specific resistance of the heavy metal layer 2 is also lower than that of the related art, and thus, the voltage drop in the heavy metal layer 2 due to the read current Ir can be suppressed, and the read delay can be suppressed.

The magnetic stacked film 1 includes the Hf layer 17 having a thickness of 0.7 nm or less between the ferromagnetic layer 18 of the recording layer 10 and the heavy metal layer 2, and thus, an increase in the saturation magnetization Ms of the ferromagnetic layer 18 due to the heat treatment can be suppressed, and as a result thereof, an increase in the write current density can also be suppressed, and therefore, the write efficiency of the recording layer 10 can be improved. In addition, in the magnetic stacked film 1, the perpendicular magnetic anisotropy of the ferromagnetic layer 18 of the recording layer 10 is increased by inserting the Hf layer 17, and is easily magnetized in the perpendicular direction with respect to the film surface, and thus, the thermal stability of the ferromagnetic layer 18 can be improved.

Figure 6A:
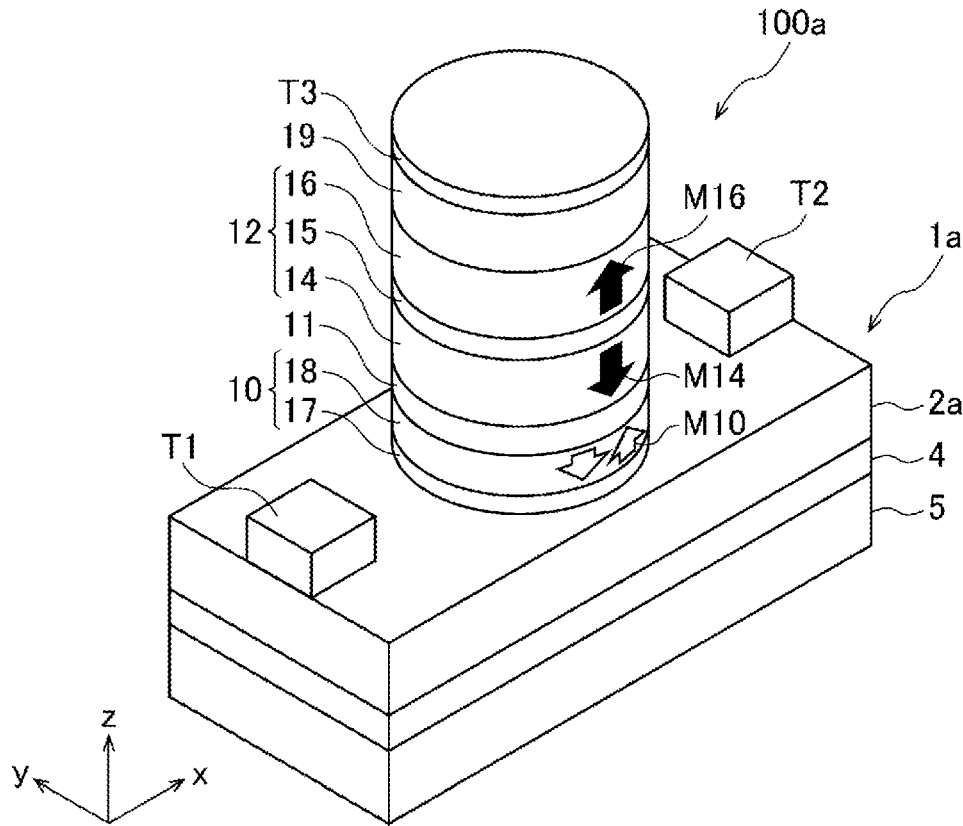
FIG. 6A is a perspective view illustrating a magnetic memory element of a second embodiment of the invention.
Figure 6B:
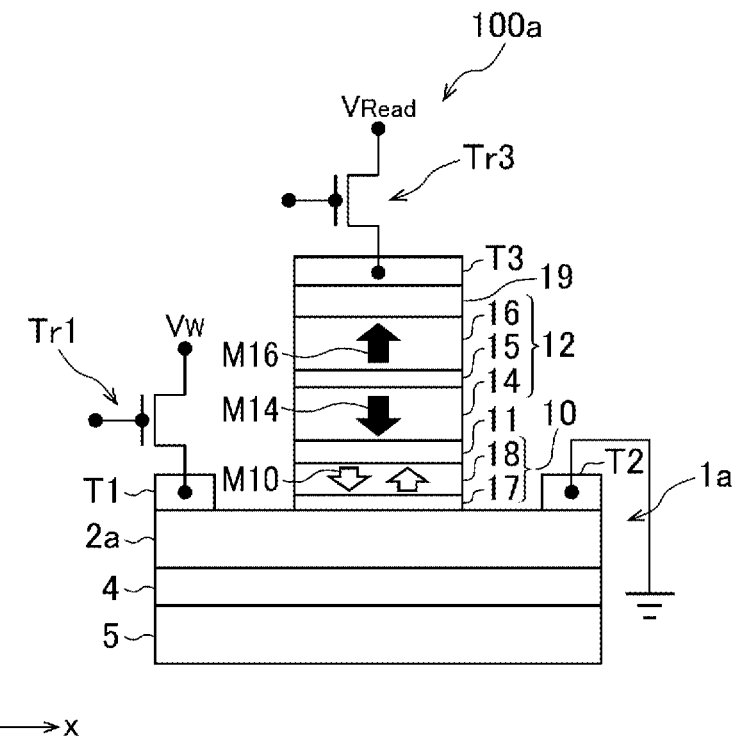
FIG. 6B is a schematic view illustrating a sectional surface of the magnetic memory element in FIG. 6A that is cut in an x direction.

(2) Magnetic Stacked Film of Second Embodiment (2-1) Configuration of Magnetic Stacked Film of Second Embodiment As illustrated in FIG. 6A and FIG. 6B in which the same reference numerals are applied to the same configurations as those in FIG. 1A and FIG. 1B, a magnetic stacked film 1a of a second embodiment is different from the magnetic stacked film 1 of the first embodiment in the configuration of a heavy metal layer 2a. The other configurations are identical to those of the magnetic stacked film 1 of the first embodiment, and thus, hereinafter, the heavy metal layer 2a will be mainly described.

The heavy metal layer 2a of the second embodiment is different from the heavy metal layer 2 of the first embodiment in that the heavy metal layer 2a contains a different material. The heavy metal layer 2a contains an α phase tungsten-tantalum alloy (hereinafter, represented as α phase $W_{1-x}Ta_x$, here, X is an atomic ratio) and has a body-centered cubic lattice structure (bcc). The composition of α phase $W_{1-x}Ta_x$ is 0.08≤X≤0.43, is preferably 0.12≤X≤0.33, is more preferably 0.15≤X≤0.30, and is even more preferably 0.23≤X≤0.28.

The heavy metal layer 2a contains α phase $W_{1-x}Ta_x$ having such a composition, and thus, a spin generating efficiency ($\theta_{SH}$) of the heavy metal layer 2a can be improved, compared with the heavy metal layer of the related art that contains α phase tungsten, platinum, or β phase tantalum, and as a result thereof, the write current density can be decreased, and the write efficiency of the recording layer 10 can be improved. In addition, the specific resistance of α phase $W_{1-x}Ta_x$ is less than 30 μΩcm, which is lower than the specific resistance (approximately 300 μΩcm) of β phase tantalum or the like of the related art, and thus, a voltage drop in the heavy metal layer 2a can be reduced, and the read delay can be suppressed. Note that, a part of the heavy metal layer 2a containing α phase $W_{1-x}Ta_x$ may be amorphous.

At least one or more of boron (B), carbon (C), nitrogen (N), oxygen (O), phosphorus (P), and the like are added to a phase $W_{1-x}Ta_x$, and thus, $\theta_{SH}$ due to an exogenous mechanism can be improved, and in this case, the specific resistance can also be increased. Therefore, desired $\theta_{SH}$ and the specific resistance of the heavy metal layer 2a can be designed by adding such impurities to α phase $W_{1-x}Ta_x$.

A film thickness of the heavy metal layer 2a (a length in the z direction) may be 2.5 nm or more and 10 nm or less. It is desirable that the film thickness is 2.5 nm or more since α phase $W_{1-x}Ta_x$ in the composition range described above can be formed. In addition, in a case where the heavy metal layer 2a is excessively thick, a reversal efficiency decreases, and thus, it is desirable that the film thickness is 10 nm or less.

The heavy metal layer 2a containing α phase $W_{1-x}Ta_x$ can be prepared by using the same method as that of the heavy metal layer 2 containing β phase $W_{1-x}Ta_x$, and by setting a gas pressure in the film formation to be lower than that of the case of preparing the heavy metal layer with β phase $W_{1-x}Ta_x$. It is determined whether $W_{1-x}Ta_x$ is an α phase or a β phase even in accordance with a combination of the film thickness and the composition (a mixing ratio of tantalum), and thus, the α phase and the β phase can be separately formed by preparing in advance a phase diagram including the composition and the film thickness. In addition, as with the magnetic stacked film 1 of the first embodiment, the magnetic stacked film 1a of the second embodiment can be used in a perpendicular magnetization type SOT-MRAM element as a magnetic memory element.

(2-2) Action and Effect

In the configuration described above, the magnetic stacked film 1a of the second embodiment is a stacked film for magnetic memory element and includes the heavy metal layer 2a containing α phase $W_{1-x}Ta_x$ (0.08≤x≤0.43), and the recording layer 10 that includes the ferromagnetic layer 18 having the reversible magnetization M10 and is adjacent to the heavy metal layer 2a.

Accordingly, in the magnetic stacked film 1a, the heavy metal layer 2a contains α phase $W_{1-x}Ta_x$ (0.08≤x≤0.43), and thus, the spin generating efficiency is higher than that of the magnetic stacked film of the related art that contains α phase tungsten, platinum, or β phase tantalum, and thus, the write current density can be decreased, and the write efficiency of the magnetic memory element 100 can be improved. In addition, the specific resistance of the heavy metal layer 2a is also lower than that of the related art, the voltage drop due to the read current Ir can be suppressed, and the read delay can be suppressed.

The magnetic stacked film 1a includes the Hf layer 17 having a thickness of 0.7 nm or less between the ferromagnetic layer 18 of the recording layer 10 and the heavy metal layer 2a, and thus, an increase in the saturation magnetization Ms of the ferromagnetic layer 18 of the recording layer 10 due to the heat treatment can be suppressed, and as a result thereof, an increase in the write current density can also be suppressed, and therefore, the write efficiency of the recording layer 10 can be improved. In addition, in the magnetic stacked film la, the perpendicular magnetic anisotropy of the ferromagnetic layer 18 of the recording layer 10 is increased by inserting the Hf layer 17, and is easily magnetized in the perpendicular direction with respect to the film surface, and thus, the thermal stability of the ferromagnetic layer 18 can be improved.

(3) Modification Examples

The invention is not limited to the embodiments described above, and various modifications can be made within the scope of the gist of the invention.

Modification Example 1

In the first embodiment described above, the magnetic stacked film 1 has been described in which the ferromagnetic layer 18 of the recording layer 10 has the reversible magnetization in the direction perpendicular to the in-plane direction, but the invention is not limited thereto, and the ferromagnetic layer of the recording layer may have the reversible magnetization in the in-plane direction. In this case, the ferromagnetic layer has an easy axis of magnetization in the in-plane direction. For example, the shape of the recording layer that is seen from the upper surface is set to a shape including a longitudinal direction and a transverse direction, such as a rectangular shape or an elliptical shape. Accordingly, the easy axis of magnetization along the longitudinal direction of the recording layer can be generated on the plane of the ferromagnetic layer by the shape magnetic anisotropy. As a result thereof, the magnetization of the ferromagnetic layer is directed to the in-plane direction (the direction of the easy axis of magnetization), and the magnetization of the ferromagnetic layer can be reversed in the in-plane direction.

Figure 7A:
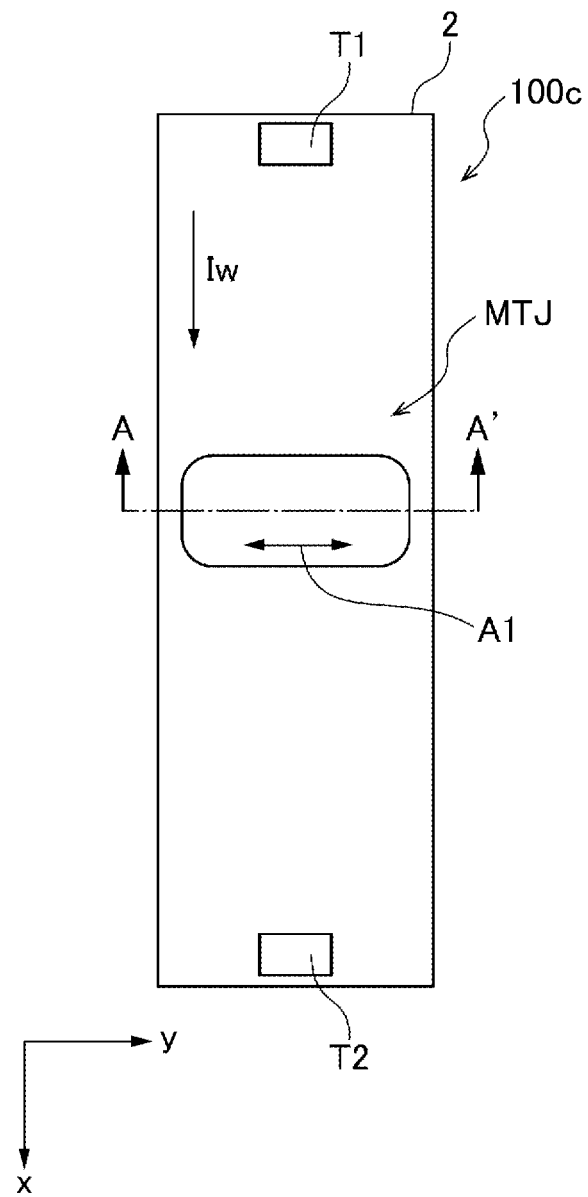
FIG. 7A is a schematic view illustrating an upper surface of a magnetic memory element of a modification example.
Figure 7B:
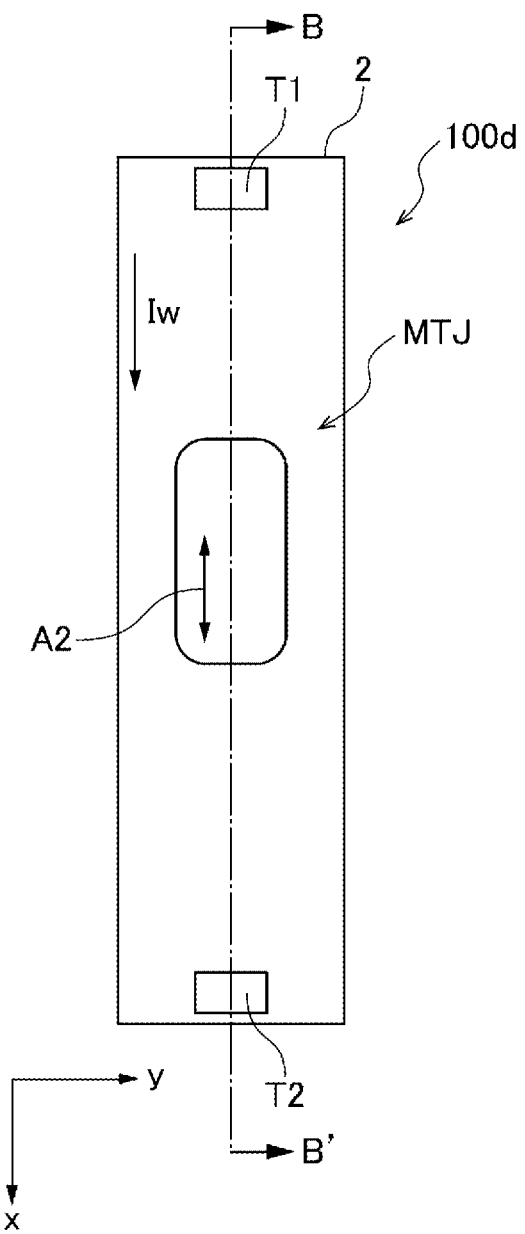
FIG. 7B is a schematic view illustrating an upper surface of a magnetic memory element of a modification example.
Figure 8A:
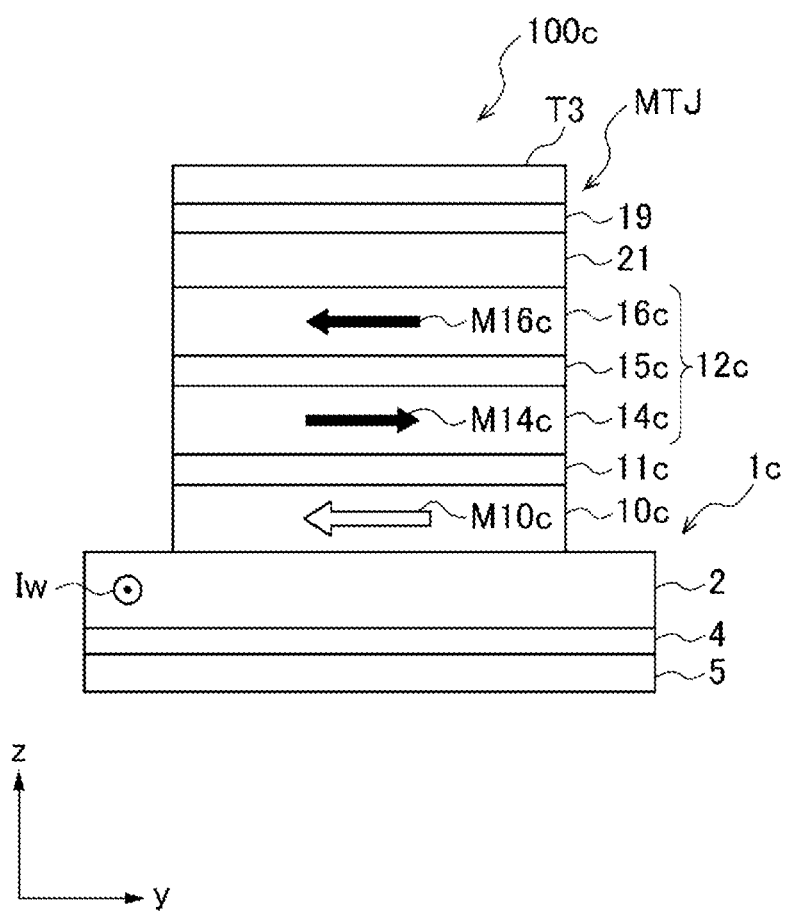
FIG. 8A is a schematic view illustrating an A-A' sectional surface of the magnetic memory element illustrated in FIG. 7A.
Figure 8B:
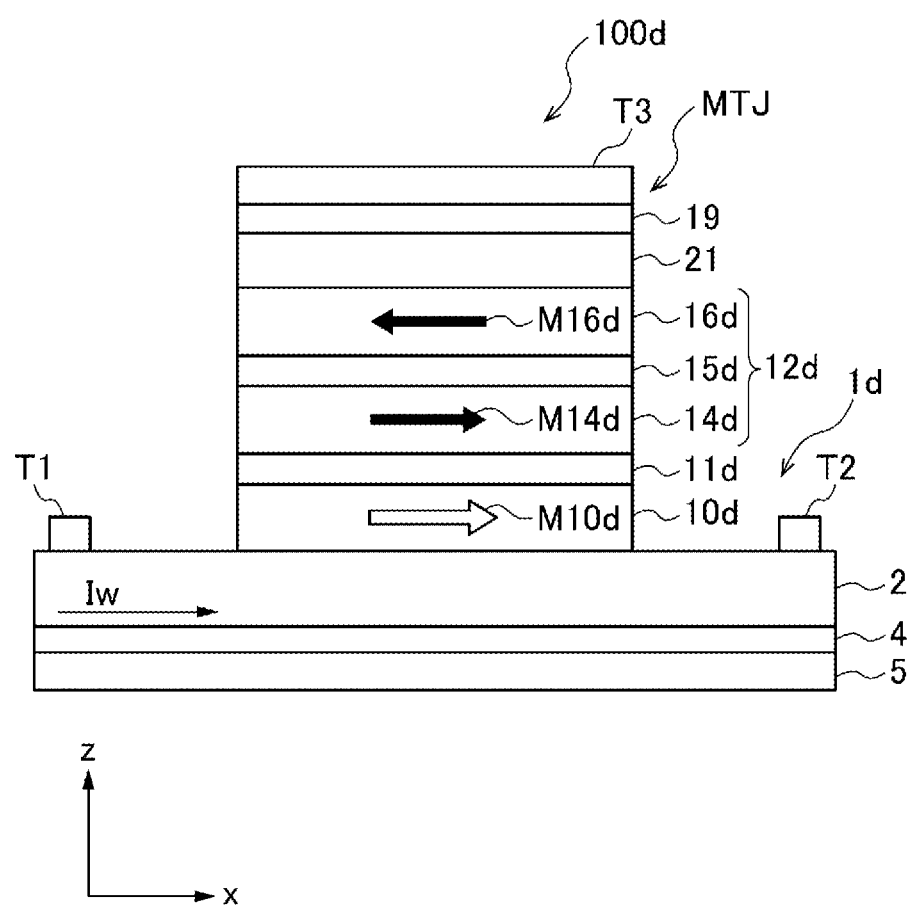
FIG. 8B is a schematic view illustrating a B-B' sectional surface of the magnetic memory element illustrated in FIG. 7B.

An in-plane magnetization type SOT-MRAM element can be prepared by using the magnetic stacked film of Modification Example 1 that includes the recording layer having the reversible magnetization in the in-plane direction. In FIG. 7A, FIG. 7B, FIG. 8A, and FIG. 8B in which the same reference numerals are applied to the same configurations as those in FIG. 1A and FIG. 1B, magnetic memory elements 100c and 100d using the magnetic stacked film of Modification Example 1 are illustrated. FIG. 7A is a schematic view illustrating an upper surface of the magnetic memory element 100c, and FIG. 7B is a schematic view illustrating an upper surface of the magnetic memory element 100d. Then, FIG. 8A is a schematic view illustrating an A-A' sectional surface of the magnetic memory element 100c illustrated in FIG. 7A, and FIG. 8B is a schematic view illustrating a B-B' sectional surface of the magnetic memory element 100d illustrated in FIG. 7B.

In the magnetic memory element 100c illustrated in FIG. 7A, the MTJ is molded such that the shape seen from the upper surface is a rectangular shape (the MTJ having a rectangular parallelepiped shape), and the MTJ is disposed such that a longitudinal direction of the MTJ is perpendicular to the longitudinal direction of the heavy metal layer 2. For this reason, in the magnetic memory element 100c, a ferromagnetic layer of a recording layer 10c is magnetized in the in-plane direction by the shape magnetic anisotropy, and the direction of magnetization M10c of the ferromagnetic layer is perpendicular to the longitudinal direction of the heavy metal layer 2 (the direction in which the write current Iw is applied) (a direction represented by an arrow A1 in FIG. 7A).

In the magnetic memory element 100d illustrated in FIG. 7B, the MTJ is formed such that the shape seen from the upper surface is a rectangular shape (the MTJ having a rectangular parallelepiped shape), and the MTJ is disposed such that the longitudinal direction of the MTJ is parallel to the longitudinal direction of the heavy metal layer 2. For this reason, in the magnetic memory element 100*d*, a ferromagnetic layer of a recording layer 10*d* is magnetized in the in-plane direction by the shape magnetic anisotropy, and the direction of magnetization M10*d* of the ferromagnetic layer is parallel to the longitudinal direction of the heavy metal layer 2 (the direction in which the write current is applied) (a direction represented by an arrow A2 in FIG. 7B).

In an in-plane magnetization type magnetic memory element, it is more preferable that the reversible magnetization direction of the ferromagnetic layer (the direction of the easy axis of magnetization) is shifted from a direction parallel or antiparallel to the direction of the write current to be applied to the heavy metal layer 2 since a high speed can be attained and the external magnetic field generating device is not required. For example, it is preferable that the ferromagnetic layer of the recording layer is magnetized in the in-plane direction, and the magnetization direction is set to a direction of 5 degrees to 45 degrees with respect to the direction of the write current Iw, and thus, the ferromagnetic layer is reversible in the direction described above.

In the magnetic memory element 100*c* illustrated in FIG. 8A, a barrier layer 11*c*, a reference layer 12*c*, an antiferromagnetic layer 21, and the cap layer 19 are formed in this order, adjacent to the recording layer 10*c* of a magnetic stacked film 1*c*, and the recording layer 10*c*, the barrier layer 11*c*, the reference layer 12*c*, the antiferromagnetic layer 21, and the cap layer 19 configures a MTJ. The magnetic memory element 100*c* is different from the magnetic memory element 100 of the first embodiment in that the recording layer 10*c* does not include a Hf layer, the magnetization M10*c* of the ferromagnetic layer of the recording layer 10*c* and magnetization M14*c* and magnetization M16*c* of ferromagnetic layers 14*c* and 16*c* of the reference layer are magnetized in a direction perpendicular to the direction of the write current Iw to be applied to the heavy metal layer 2 in the in-plane direction (in FIG. 8A, a direction directed to the near side of the paper from the deep side of the paper), and the antiferromagnetic layer 21 is provided. The other configurations are identical to those of the magnetic memory element 100 of the first embodiment.

The antiferromagnetic layer 21 is provided in order to fix the magnetization direction of the reference layer 12*c*. The antiferromagnetic layer 21, for example, includes an antiferromagnetic body such as Ir—Mn, Pt—Mn, and Ni—Mn, and is formed to have a thickness of approximately 5 nm to 15 nm. The antiferromagnetic layer 21 is provided on the reference layer 12*c*, and thus, the direction of the magnetization M16*c* of the ferromagnetic layer 16*c* of the reference layer 12*c* in contact with the antiferromagnetic layer 21 is fixed in a predetermined direction on the plane of the ferromagnetic layer 16*c* by an antiferromagnetic interaction of the antiferromagnetic body configuring the antiferromagnetic layer 21. As a result thereof, the direction of the magnetization M14*c* of the ferromagnetic layer 14*c* that is antiferromagnetically bonded to the magnetization M16*c* of the ferromagnetic layer 16*c* by the interlayer interaction is fixed in a direction antiparallel to the magnetization M16*c* on the plane of the ferromagnetic layer 14*c*. In magnetization directions of the magnetization M14*c* and the magnetization M16*c*, the heat treatment is performed in a magnetic field, and thus, the magnetization M14*c* and the magnetization M16*c* can be fixed in the direction of the magnetic field or in a direction antiparallel to the magnetic field. As described above, the antiferromagnetic layer 21 fixes the magnetization direction of the reference layer 12*c* in the predetermined direction. In this embodiment, the antiferromagnetic layer 21 fixes the magnetization M14*c* and the magnetization M16*c* by the heat treatment in the magnetic field to be approximately parallel or antiparallel to the direction of the easy axis of magnetization of the ferromagnetic layer of the recording layer 10*c*. Note that, the antiferromagnetic layer 21 may not be used, and as with the first embodiment, the magnetization direction may be fixed by the interlayer interaction between the ferromagnetic layer 14 and the ferromagnetic layer 16.

In the magnetic memory element 100*d* illustrated in FIG. 8B, a barrier layer 11*d*, a reference layer 12*d*, the antiferromagnetic layer 21, and the cap layer 19 are formed in this order, adjacent to the recording layer 10*d* of a magnetic stacked film 1*d*, and the recording layer 10*d*, the barrier layer 11*d*, the reference layer 12*d*, the antiferromagnetic layer 21, and the cap layer 19 configure a MTJ. The magnetic memory element 100*d* is different from the magnetic memory element 100*c* described above in that the magnetization M10*d* of the ferromagnetic layer of the recording layer 10*d* and magnetization M14*d* and magnetization M16*d* of ferromagnetic layers 14*d* and 16*d* of the reference layer are magnetized in a direction perpendicular to the direction of the write current Iw to be applied to the heavy metal layer 2 in the in-plane direction (in FIG. 8B, a direction directed to the right side of the paper from the left side of the paper). The other configurations are identical to those of the magnetic memory element 100*c*. Note that, in the magnetic memory element 100*d*, a magnetic field generating device that is not illustrated is provided in the vicinity of the magnetic memory element 100*d*, and when the magnetization M10*d* of the ferromagnetic layer of the recording layer 10 is reversed, that is, when the write operation is performed, it is necessary that a magnetic field in the +z direction or the −z direction (a direction orthogonal to the surface of the heavy metal layer 2 on which the MTJ is formed) is applied to the magnetic memory element 100*d* by the magnetic field generating device.

As described above, the magnetic stacked films 1*c* and 1*d* include the heavy metal layer 2 containing β phase $W_{1-x}Ta_x$ having the same composition as that of the first embodiment, and thus, as with the magnetic stacked film 1 of the first embodiment, write efficiencies of the magnetic memory elements 100*c* and 100*d* can be improved. Note that, the magnetic stacked films 1*c* and 1*d* may include the heavy metal layer 2*a* containing α phase $W_{1-x}Ta_x$ having the same composition as that of the second embodiment instead of the heavy metal layer 2, and obtains the same effect.

Modification Example 2

Figure 9:
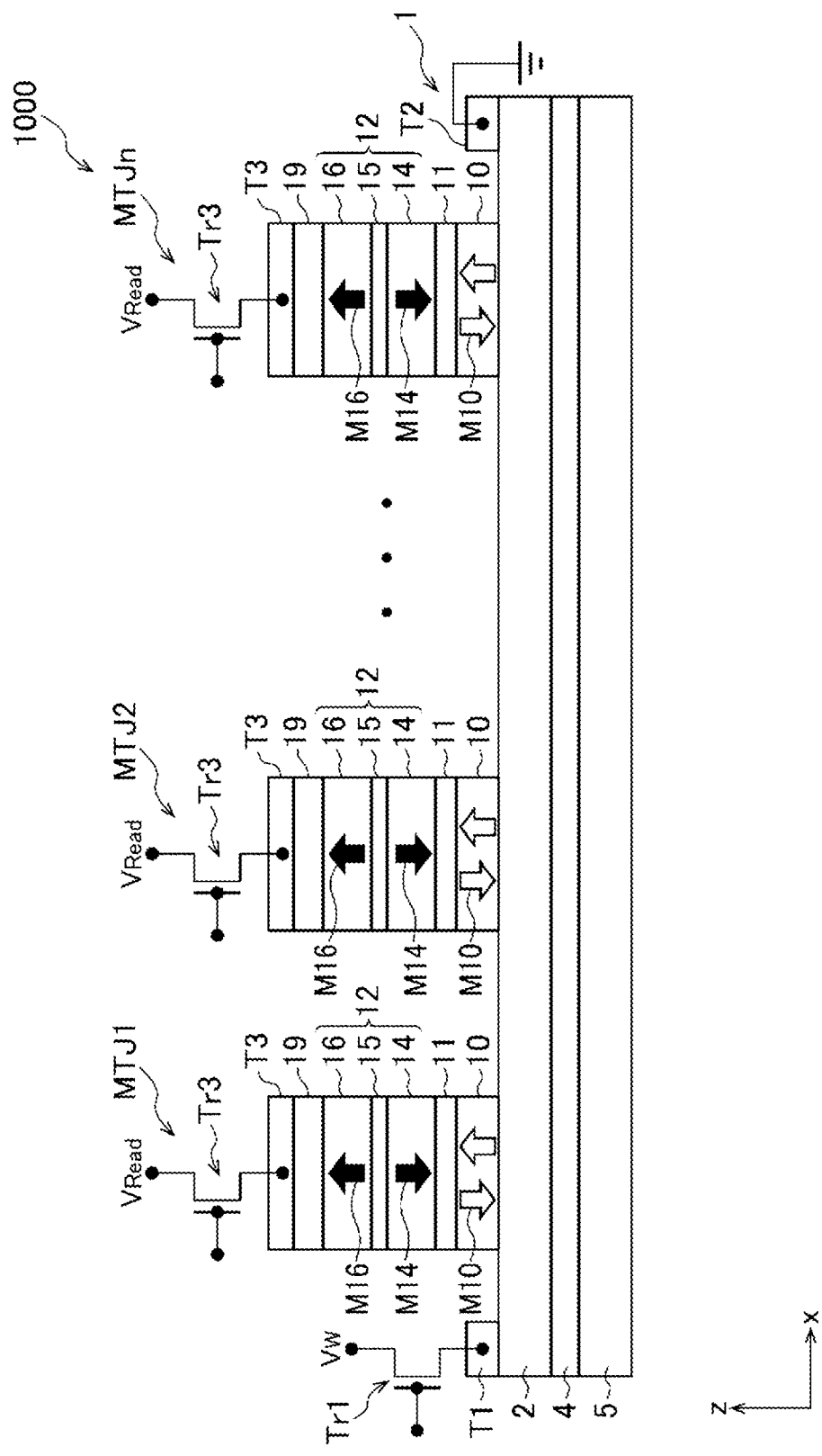
FIG. 9 is a diagram illustrating a magnetic memory element of a modification example.

In the embodiments described above, a case has been described in which the magnetic stacked film 1 includes one recording layer 10 in one heavy metal layer 2, and the magnetic memory element 100 includes one MTJ in one heavy metal layer 2, but the invention is not limited thereto. For example, as with a magnetic stacked film 1001 illustrated in FIG. 9, a plurality of recording layers 10 may be provided in one heavy metal layer 2, and as with a magnetic memory element 1000, one magnetic memory element may include a plurality of (in FIG. 9, n) MTJs. The configuration of the MTJ of the magnetic memory element 1000 is identical to the configuration of the MTJ of the magnetic memory element 100. In FIG. 9, for convenience, the Hf layer of the recording layer 10 is not illustrated.

A write method of such a magnetic memory element 1000 will be described. In the initial state, all of the first transistor Tr1 connected to the first terminal T1 of the heavy metal layer 2 and the third transistors Tr3 connected to the third terminal T3 of each of the MTJs are turned off. First, all of the third transistors Tr3 of each of the MTJs are turned on, and the magnetic anisotropy of the recording layers 10 of each of the MTJs is decreased. Next, the write voltage $V_w$ is set to a positive voltage, the first transistor Tr1 is turned on, and the write current Iw is applied to the second terminal T2 from the first terminal T1. Accordingly, "0" is written in all of the MTJs at once. After that, all of the third transistors Tr3 are turned off, and the first transistor Tr1 is turned off.

Next, the third transistor Tr3 of a MTJ in which "1" is to be written is turned on such that the MTJ in which data is to be written is selected. After that, the write voltage $V_w$ is set to a negative voltage, the first transistor Tr1 is turned on, and the write current Iw is applied to the first terminal T1 from the second terminal T2. Only in the MTJ of which the third transistor Tr3 is turned on, the magnetic anisotropy of the recording layer 10 is small and thus, magnetization reversal is performed. As a result thereof, 1 is written only in the selected MTJ. After that, all of the third transistors Tr3 are turned off, the first transistor Tr1 is turned off, and the write operation is ended. Note that, 1 may be written in all of the MTJs at once, and then, "0" may be written only in the selected MTJ. In addition, the read operation is performed by turning on the first transistor Tr1, and then, by turning on a third transistor of a MTJ from which data is to be read, and by applying the read current Ir to the MTJ from which data is to be read. The subsequent read operation is identical to that of the first embodiment, and thus, the description thereof will be omitted.

In the magnetic memory element 1000, the magnetization directions of the ferromagnetic layers of each of the recording layers 10 of the magnetic stacked film 1001 are perpendicular to the in-plane direction, and the MTJ is a perpendicular magnetization type SOT-MRAM element, but the magnetization directions of each of the recording layers of the magnetic stacked film may be set to the in-plane direction, and the MTJ may be set to an in-plane magnetization type SOT-MRAM element. It is preferable that the MTJ of the magnetic memory element 1000 is set to a perpendicular magnetization type or an in-plane magnetization type, but may be set to a mix of the perpendicular magnetization type and the in-plane magnetization type.

As described above, the magnetic stacked film 1001 includes the heavy metal layer 2 containing β phase $W_{1-x}Ta_x$ having the same composition as that of the first embodiment, and thus, the spin generating efficiency is higher than that of the related art, and the write efficiency can be improved. Note that, the magnetic stacked film 1001 may include the heavy metal layer 2a containing α phase $W_{1-x}Ta_x$ having the same composition as that of the second embodiment instead of the heavy metal layer 2, and obtains the same effect. In addition, a magnetic memory can be configured by arranging a plurality of magnetic memory elements 1000.

Figure 10A:
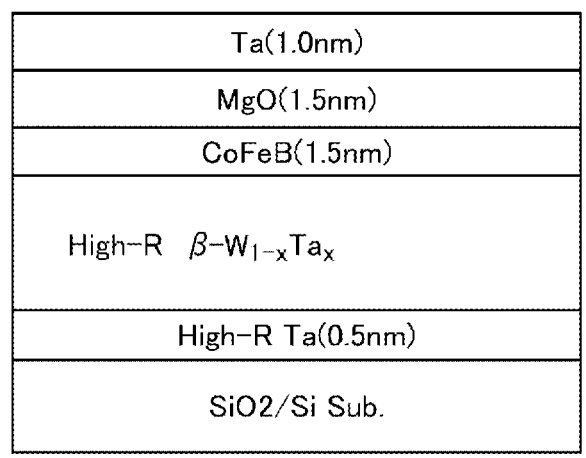
FIG. 10A is a schematic view illustrating a structure of a magnetic stacked film used in a verification experiment.

(Verification Experiment)
(Verification Experiment 1)
In Verification Experiment 1, in order to examine a spin generating efficiency $\theta_{SH}$ of a magnetic stacked film including a heavy metal layer containing β phase $W_{1-x}Ta_x$, a magnetic stacked film having a configuration illustrated in FIG. 10A was prepared by changing the composition of β phase $W_{1-x}Ta_x$. In the magnetic stacked film of Verification Experiment 1, MgO is prepared as a barrier layer on a CoFeB layer as a recording layer to be in a state close to the case of being used as a magnetic memory element. Further, a Ta layer is formed as a cap layer on the MgO layer, and thus, the state of the MgO layer is prevented from being changed by oxygen or the like in the air. Such a magnetic stacked film of Verification Experiment 1 was prepared by sequentially forming each layer on a Si substrate including a $SiO_2$ layer that is a natural oxide film, formed on the surface thereof, with rf magnetron sputtering.

A β phase $W_{1-x}Ta_x$ layer was prepared by alternately stacking a tungsten layer (0.32 nm, formed at an argon gas pressure of 2.55 Pa) and a tantalum layer (0.08, 0.16, and 0.32 nm, formed at an argon gas pressure of 0.39 Pa), by stacking a cap layer of a magnetic stacked film, and then, by performing a heat treatment at 300° C. The β phase $W_{1-x}Ta_x$ layer having three compositions of $W_{0.75}Ta_{0.25}$, $W_{0.77}Ta_{0.33}$, and $W_{0.5}Ta_{0.5}$ was prepared by changing a film thickness of the tantalum layer. In addition, for comparison, a magnetic stacked film including a heavy metal layer containing tungsten was also prepared by the same method.

Figure 10B:
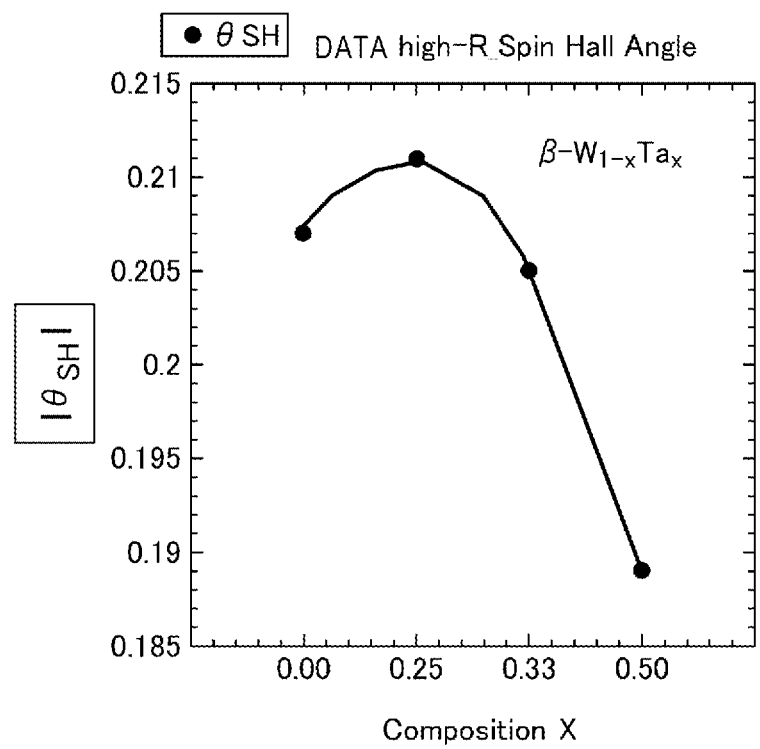
FIG. 10B is a diagram illustrating tantalum mixing ratio dependence of a spin generating efficiency.

A spin generating efficiency $\theta_{SH}$ of the prepared magnetic stacked film was obtained by measuring a spin hall magnetoresistance effect (SMR). The result thereof is illustrated in FIG. 10B. In FIG. 10B, a horizontal axis is a composition (a content ratio of Ta), and a vertical axis is an absolute value $|\theta_{SH}|$ of the spin generating efficiency. In FIG. 10B, in a case where X is 0.3 or less, the spin generating efficiency is greater than that of the tungsten layer (X=0). It was possible to check that a write current density is inversely proportional to the size of the spin generating efficiency, and thus, it is possible to decrease the write current density and to improve a write efficiency by setting the composition of the β phase $W_{1-x}Ta_x$ to 0.00<X≤0.30. Further, as illustrated in FIG. 10B, it is preferable that the composition of β phase $W_{1-x}Ta_x$ is set to be preferably 0.10≤X≤0.28, more preferably 0.17≤X≤0.25 since the spin generating efficiency can be further increased and the write efficiency can be further improved. Further, it was possible to check that the spin generating efficiency has a peak in the vicinity of 0.25, and thus, it is particularly preferable that the composition of β phase $W_{1-x}Ta_x$ is set to 0.20≤X≤0.25 since the write efficiency can be maximally improved.

(Verification Experiment 2)
In Verification Experiment 2, in order to prepare a phase diagram of α phase $W_{1-x}Ta_x$ and β phase $W_{1-x}Ta_x$, various magnetic stacked films were prepared by changing the film thickness and the composition of $W_{1-x}Ta_x$, by the same method as that of Verification Experiment 1. The structure of the prepared magnetic stacked film is identical to that of the magnetic stacked film illustrated in FIG. 10A. A method of changing the composition is identical to that of Verification Experiment 1, and the film thickness was adjusted by changing the number of W/Ta stacked films to be stacked. After that, a resistance value and a spin hall magnetoresistance ratio of the prepared magnetic stacked film were measured, and a film thickness for a phase transition was specified for each composition. The spin hall magnetoresistance ratio was obtained by SMR measurement. In addition, for comparison, a magnetic stacked film including a heavy metal layer containing tungsten was also prepared by changing a film thickness, by the same method.

Figure 11A:
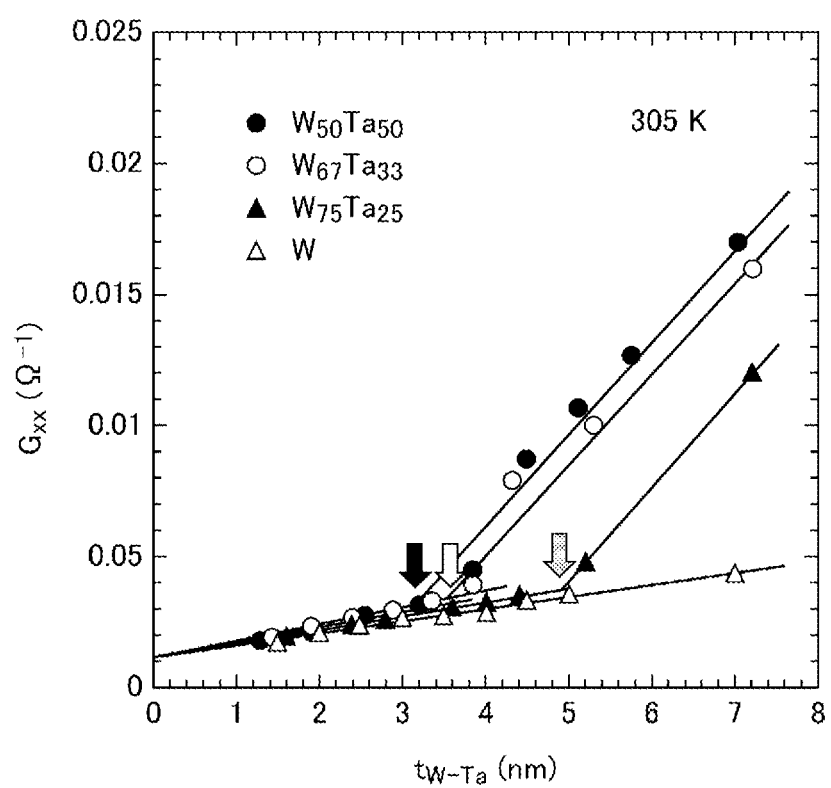
FIG. 11A is a graph showing film thickness dependence of conductance of a magnetic stacked film.
Figure 11B:
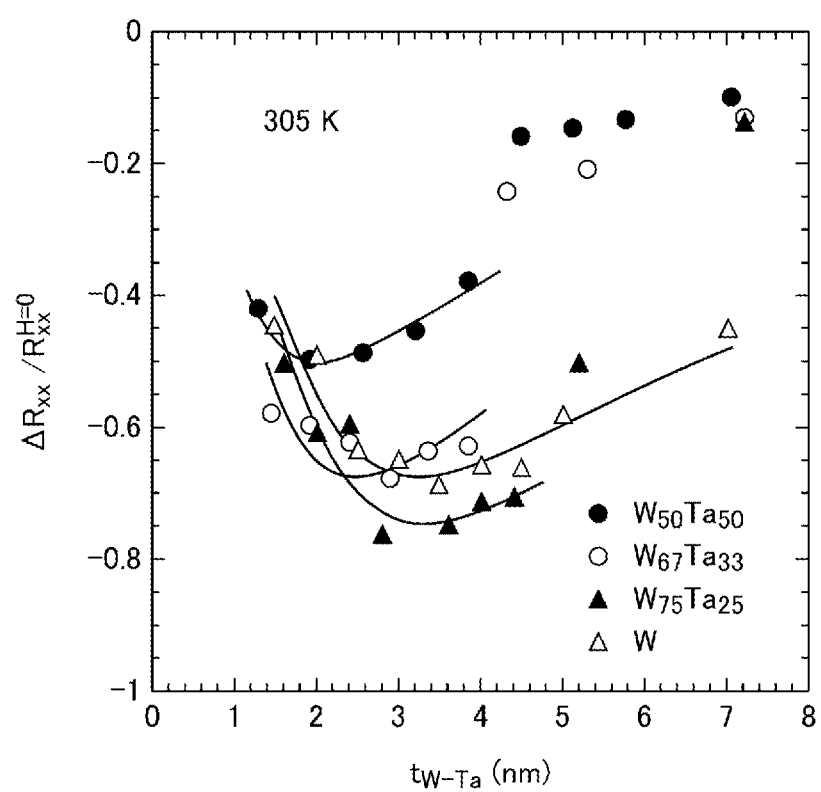
FIG. 11B is a graph showing film thickness dependence of a spin hall magnetoresistance ratio of a magnetic stacked film.

Measurement results of the resistance are shown in FIG. 11A, and measurement results of the spin hall magnetoresistance ratio are shown in FIG. 11B. In FIG. 11A, a horizontal axis is a film thickness of a $W_{1-x}Ta_x$ layer, and a vertical axis is conductance. In FIG. 11A, it is found that there is a point at which a proportional relationship between the film thickness and the conductance is changed (in FIG. 11A, a black arrow). It is possible to check that the specific resistance of α phase $W_{1-x}Ta_x$ is lower than that of β phase $W_{1-x}Ta_x$, and thus, such a point is a phase transition point, and in a case where the film thickness increases, a phase transition to α phase $W_{1-x}Ta_x$ from β phase $W_{1-x}Ta_x$ occurs. On the other hand, it is found that when tungsten is used in a heavy metal layer, the proportional relationship between the film thickness and the conductance is not changed by the film thickness, and the phase transition does not occur. In addition, in FIG. 11B, $W_{1-x}Ta_x$ has a film thickness in which the spin hall magnetoresistance ratio exponentially decreases, and the film thickness is the transition point. In the result of the spin hall magnetoresistance ratio, it is found that when tungsten is used as a heavy metal, the phase transition is not performed.

Figure 12:
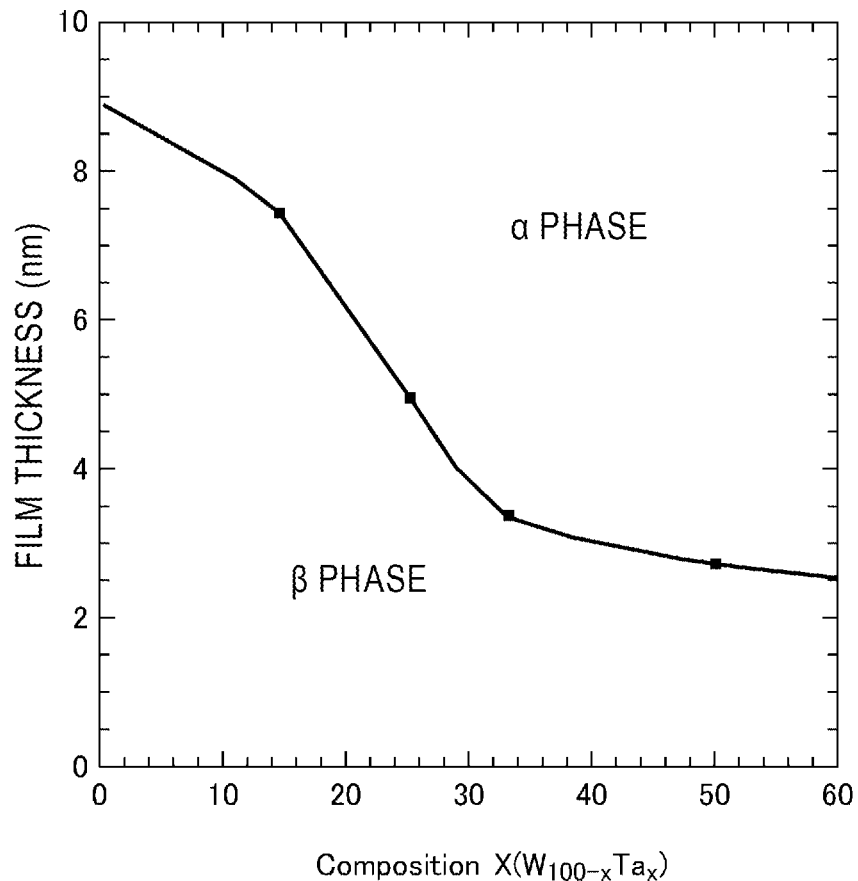
FIG. 12 is a phase diagram of a tungsten-tantalum alloy that is prepared in a verification experiment.

The phase diagram was prepared on the basis of the transition point obtained as described above. The result thereof is FIG. 12. In FIG. 12, a horizontal axis is the composition of $W_{1-x}Ta_x$, and a vertical axis is the film thickness of $W_{1-x}Ta_x$ layer. In FIG. 12, the composition is represented in percentage. An α phase $W_{1-x}Ta_x$ layer and a β phase $W_{1-x}Ta_x$ layer can be separately formed by using the phase diagram prepared as described above. Note that, X=0 indicates tungsten regardless of the film thickness. In addition, the phase diagram of Verification Experiment 2 is merely an example that is prepared by using a film formation condition in which a β phase is easily prepared, and the transition point of the film thickness between an α phase and a β phase may be different from that of FIG. 12, in accordance with the film formation condition of $W_{1-x}Ta_x$. For example, in the film formation of $W_{1-x}Ta_x$, an argon gas pressure of the tungsten layer is set to 0.39 Pa, and an argon gas pressure of the tantalum layer is set to 0.13 Pa, and thus, α phase $W_{1-x}Ta_x$ having a thickness of 2.5 nm can be prepared.

(Verification Experiment 3)

Figure 13A:
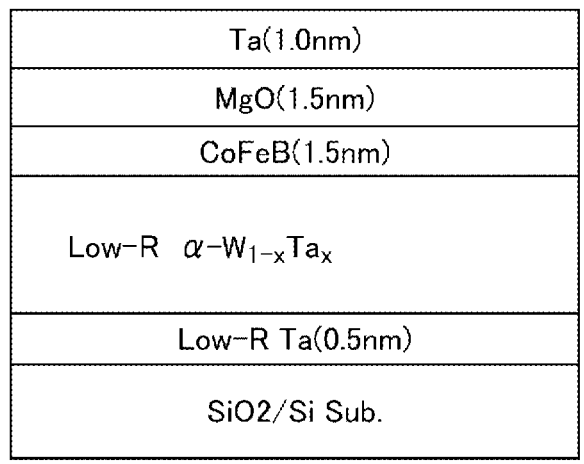
FIG. 13A is a schematic view illustrating a structure of a magnetic stacked film used in a verification experiment.

In Verification Experiment 3, in order to examine a spin generating efficiency $\theta_{SH}$ of a magnetic stacked film including a heavy metal layer containing α phase $W_{1-x}Ta_x$, a magnetic stacked film having a configuration illustrated in FIG. 13A was prepared by changing the composition of α phase $W_{1-x}Ta_x$. In the magnetic stacked film of Verification Experiment 3, as with Verification Experiment 1, MgO is prepared as a barrier layer on a CoFeB layer as a recording layer to be in a state close to the case of being used as a magnetic memory element. Further, a Ta layer is formed as a cap layer on the MgO layer. Such a heavy metal stacked film of Verification Experiment 3 was prepared by the same method as that of Verification Experiment 1, except that DC sputtering was used, film formation was performed by simultaneous sputtering of tungsten and tantalum, and an argon gas pressure in the film formation was 0.13 Pa. In Verification Experiment 3, the α phase $W_{1-x}Ta_x$ layer having four compositions of $W_{0.87}Ta_{0.13}$, $W_{0.75}Ta_{0.25}$, $W_{0.77}Ta_{0.33}$, and $W_{0.5}Ta_{0.5}$ was prepared. In addition, for comparison, a magnetic stacked film including a heavy metal layer containing tungsten was also prepared by the same method.

Figure 13B:
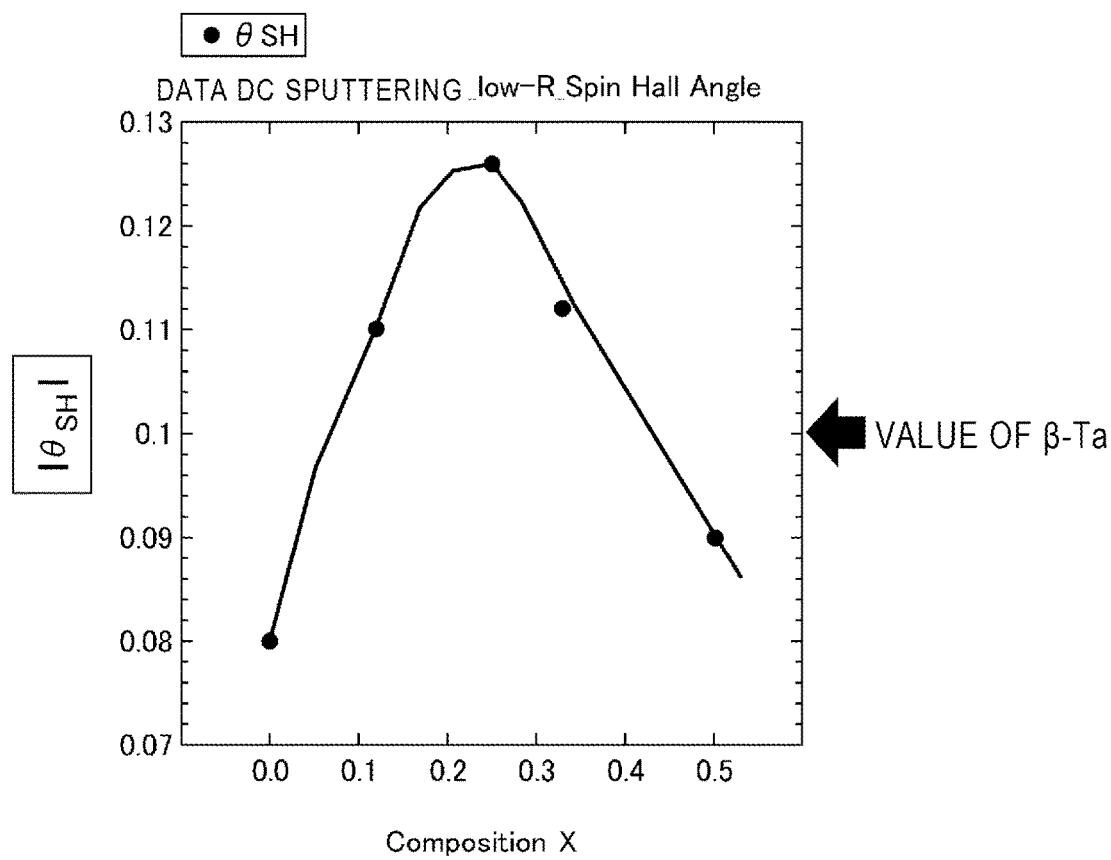
FIG. 13B is a diagram illustrating tantalum mixing ratio dependence of a spin generating efficiency.

The spin generating efficiency $\theta_{SH}$ of the prepared magnetic stacked film was obtained by the same method as that of Verification Experiment 1. The result thereof is illustrated in FIG. 13B. In FIG. 13B, a horizontal axis is a composition (a content ratio of Ta), and a vertical axis is an absolute value $|\theta_{SH}|$ of the spin generating efficiency. In FIG. 13B, it was possible to check that in the case of 0.08≤X≤0.43, the spin generating efficiency is greater than that of the tungsten layer (X=0) and β phase tantalum that has been used in a heavy metal layer from the related art, and a write efficiency can be improved by setting the composition of α phase $W_{1-x}Ta_x$ to 0.08≤X≤0.43. Further, as illustrated in FIG. 13B, it is preferable that the composition of α phase $W_{1-x}Ta_x$ is set to be preferably 0.12≤X≤0.33, more preferably 0.15≤X≤0.30 since the spin generating efficiency can be further increased and the write efficiency can be further improved. Further, it was possible to check that the spin generating efficiency has a peak in the vicinity of 0.25, and thus, it is particularly preferable that the composition of α phase $W_{1-x}Ta_x$ is set to 0.23≤X≤0.28 since the write efficiency can be maximally improved.

(Verification Experiment 4)

In Verification Experiment 4, in order to check an effect of including a Hf layer between a ferromagnetic layer of a recording layer and a heavy metal layer, a magnetic memory element was prepared by performing film formation with respect to Ta (1.0 nm), β phase $W_{0.75}Ta_{0.25}$ (5.0 nm), Hf (0.3 nm or 0.7 nm), CoFeB (1.1 nm to 1.9 nm), MgO (1.5 nm), and Ta (1.0 nm) in this order, on a Si substrate including $SiO_2$ formed on the surface thereof, with rf sputtering, and by performing a heat treatment at 400° C. An argon gas pressure at the time of forming an extremely thin tungsten layer and an extremely thin tantalum layer is identical to that of Verification Experiment 1. For comparison, a magnetic memory element having the same structure as described above except that the Hf layer is not provided was prepared. A product of a magnetic anisotropy constant Keff of the prepared magnetic memory element and an effective film thickness t* of the ferromagnetic layer, and saturation magnetization Ms were evaluated by a vibrating sample magnetometer (VSM).

Figure 14A:
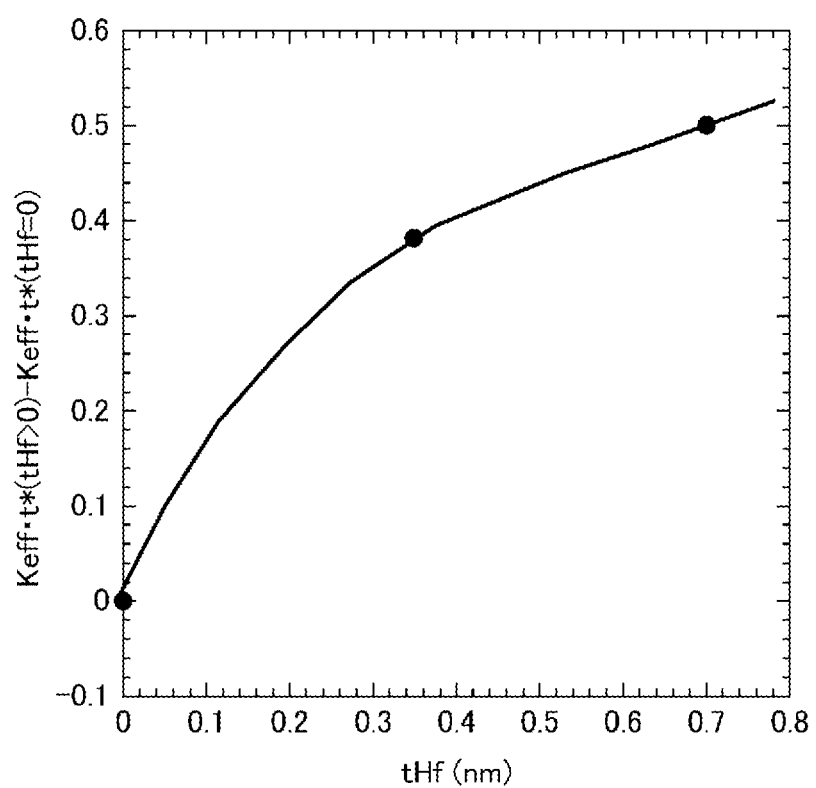
FIG. 14A is a graph showing Hf film thickness dependence of a magnetic anisotropy constant of a ferromagnetic layer.
Figure 14B:
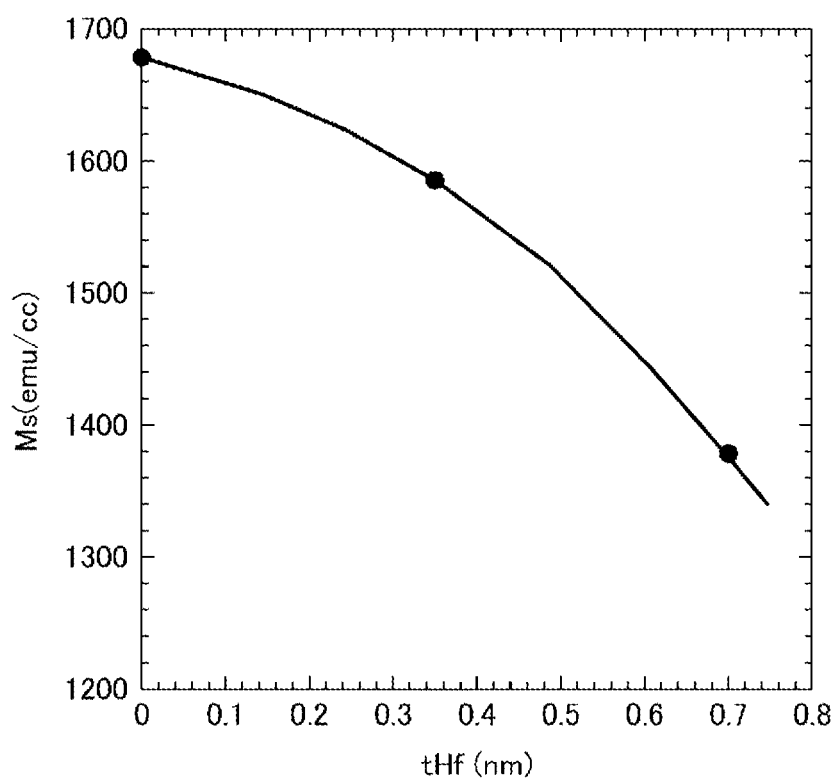
FIG. 14B is a graph showing Hf film thickness dependence of saturation magnetization of a ferromagnetic layer.

The results of the magnetic anisotropy constant Keff and the saturation magnetization Ms evaluated by the VSM are shown in FIG. 14A and FIG. 14B. In FIG. 14A, a horizontal axis is a film thickness of the Hf layer, and a vertical axis is a value obtained by multiplying the magnetic anisotropy constant Keff by the film thickness t* of the ferromagnetic layer and is represented by a difference from a value when the Hf layer is not provided. In FIG. 14B, a horizontal axis is the film thickness of the Hf layer, and a vertical axis is the saturation magnetization Ms.

In FIG. 14A, it is found that perpendicular magnetic anisotropy is increased by including the Hf layer. Accordingly, it was possible to check that the perpendicular magnetic anisotropy of the ferromagnetic layer of the recording layer is increased by including the Hf layer, magnetization is easily performed in a perpendicular direction with respect to a film surface, and a perpendicular magnetization film can be prepared up to a region in which the ferromagnetic layer is thicker, and thus, a thermal stability of the ferromagnetic layer can be improved. In addition, in FIG. 14B, the saturation magnetization Ms is decreased by including the Hf layer. That is, it is found that an increase in the saturation magnetization Ms due to the heat treatment is suppressed. Accordingly, an increase in the saturation magnetization Ms of the ferromagnetic layer of the recording layer can be suppressed by including the Hf layer, and as a result thereof, an increase in a write current density can also be suppressed, and thus, a write efficiency of the recording layer can be improved. In addition, it was possible to check that it is preferable that the Hf layer 17 is formed to have a thickness of 0.7 nm or less.

REFERENCE SIGN LIST 1, 1a, 1c, 1d, 1001: Magnetic stacked film
2, 2a: Heavy metal layer
10, 10c, 10d: Recording layer
11, 11c, 11d: Barrier layer
12, 12c, 12d: Reference layer 100, 100a, 100c, 100d, 102, 1000: Magnetic memory element
Iw: Write current
Ir: Read current

The invention claimed is:

1. A magnetic memory element, comprising:
a magnetic stacked film comprising a heavy metal layer that contains β phase $W_{1-x}Ta_x$ (0.00<x≤0.30); and a recording layer that includes a ferromagnetic layer having a reversible magnetization direction and is adjacent to the heavy metal layer, wherein a thickness of the heavy metal layer is 2 nm or more and 8 nm or less;
a barrier layer that is adjacent to the recording layer;
a reference layer that is adjacent to the barrier layer and has a fixed magnetization direction;
a first terminal that is provided on one end of the heavy metal layer in a longitudinal direction and is capable of introducing a current to the heavy metal layer;
a second terminal that is provided on the other end of the heavy metal layer in the longitudinal direction and is capable of introducing a current to the heavy metal layer; and
a third terminal that is electrically connected to the reference layer,
wherein the magnetization direction of the ferromagnetic layer of the recording layer is reversed by a write current to be applied to the heavy metal layer, and the write current is applied between the first terminal and the second terminal through the heavy metal layer.

2. The magnetic memory element according to claim 1, wherein a part of the heavy metal layer is amorphous, and the thickness of the heavy metal layer is 2 nm or more and 5 nm or less.

3. The magnetic memory element according to claim 1, wherein the heavy metal layer contains β phase $W_{1-x}Ta_x$ (0.10≤x≤0.28).

4. The magnetic memory element according to claim 1, further comprising:
a Hf layer between the ferromagnetic layer of the recording layer and the heavy metal layer.

5. The magnetic memory element according to claim 4, wherein the Hf layer contains Zr.

6. A magnetic memory element, comprising: a magnetic stacked film comprising a heavy metal layer that contains α phase $W_{1-x}Ta_x$ (0.08≤x≤0.43); and a recording layer that includes a ferromagnetic layer having a reversible magnetization direction and is adjacent to the heavy metal layer, wherein a thickness of the heavy metal layer is 2.5 nm or more;
a barrier layer that is adjacent to the recording layer;
a reference layer that is adjacent to the barrier layer and has a fixed magnetization direction;
a first terminal that is provided on one end of the heavy metal layer in a longitudinal direction and is capable of introducing a current to the heavy metal layer;
a second terminal that is provided on the other end of the heavy metal layer in the longitudinal direction and is capable of introducing a current to the heavy metal layer; and
a third terminal that is electrically connected to the reference layer,
wherein the magnetization direction of the ferromagnetic layer of the recording layer is reversed by a write current to be applied to the heavy metal layer, and the write current is applied between the first terminal and the second terminal through the heavy metal layer.

7. The magnetic memory element according to claim 6, wherein the α phase $W_{1-x}Ta_x$ (0.08≤x≤0.43) includes at least one or more of B, C, N, O, and P.

8. The magnetic memory element according to claim 6, further comprising:
a Hf layer between the ferromagnetic layer of the recording layer and the heavy metal layer.

9. The magnetic memory element according to claim 8, wherein the Hf layer contains Zr.

10. The magnetic memory element according to claim 1, wherein the ferromagnetic layer of the recording layer is magnetized in a direction perpendicular to a film surface.

11. The magnetic memory element according to claim 1, wherein the ferromagnetic layer of the recording layer is magnetized in an in-plane direction, and the magnetization direction is parallel to a direction of the write current.

12. The magnetic memory element according to claim 1, wherein the ferromagnetic layer of the recording layer is magnetized in an in-plane direction, and the magnetization direction is perpendicular to a direction of the write current.

13. The magnetic memory element according to claim 1, wherein the ferromagnetic layer of the recording layer is magnetized in an in-plane direction, and the magnetization direction is a direction of 5 degrees to 45 degrees with respect to a direction of the write current.

14. The magnetic memory element according to claim 1, wherein the reference layer includes two ferromagnetic layers having fixed magnetization directions in directions that are antiparallel to each other, and
the magnetization direction of the ferromagnetic layer of the recording layer is capable of being directed to a direction that is identical to any one direction of the ferromagnetic layers of the reference layer.

15. A magnetic memory, comprising:
the magnetic memory element according to claim 1;
a write unit that includes a write power supply writing data in the magnetic memory element by applying the write current to the heavy metal layer; and
a read unit that includes a read power supply applying a read current penetrating through the barrier layer, and a current detector reading data written in the magnetic memory element by detecting the read current that penetrates through the barrier layer.

* * * * *